United States Patent
Koezuka et al.

(10) Patent No.: US 9,260,779 B2
(45) Date of Patent: Feb. 16, 2016

(54) LIGHT-TRANSMITTING CONDUCTIVE FILM, DISPLAY DEVICE, ELECTRONIC DEVICE, AND MANUFACTURING METHOD OF LIGHT-TRANSMITTING CONDUCTIVE FILM

(75) Inventors: Junichi Koezuka, Atsugi (JP); Tetsunori Maruyama, Atsugi (JP); Takayuki Saito, Atsugi (JP); Yuki Imoto, Atsugi (JP); Noriaki Uto, Atsugi (JP); Yuta Endo, Atsugi (JP); Hitomi Shionoya, Atsugi (JP); Takuya Hirohashi, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1024 days.

(21) Appl. No.: 12/781,894

(22) Filed: May 18, 2010

(65) Prior Publication Data

US 2010/0294535 A1 Nov. 25, 2010

(30) Foreign Application Priority Data

May 21, 2009 (JP) .................................. 2009-123433
Jun. 5, 2009 (JP) .................................. 2009-136538

(51) Int. Cl.
*C23C 14/08* (2006.01)
*C23C 14/34* (2006.01)
(Continued)

(52) U.S. Cl.
CPC .......... *C23C 14/3414* (2013.01); *C23C 14/0676* (2013.01); *C23C 14/5806* (2013.01); *C23C 14/541* (2013.01)

(58) Field of Classification Search
CPC .............. C23C 14/0676; C23C 14/541; C23C 14/3414
See application file for complete search history.

(56) References Cited

U.S. PATENT DOCUMENTS

| 4,387,387 A | 6/1983 | Yamazaki |
| 4,808,462 A | 2/1989 | Yaba et al. |

(Continued)

FOREIGN PATENT DOCUMENTS

| AU | 587122 | 8/1989 |
| EP | 1997931 A | 12/2008 |

(Continued)

OTHER PUBLICATIONS

Kobayashi.K et al., "Electrical and optical properties of ZnO films prepared by sputtering of ZnO targets containing AlN ,", Applied Surface Science, Mar. 30, 2007, vol. 253, No. 11, pp. 5035-5039.

(Continued)

*Primary Examiner* — Keith Hendricks
*Assistant Examiner* — Timon Wanga
(74) *Attorney, Agent, or Firm* — Eric J. Robinson; Robinson Intellectual Property Law Office, P.C.

(57) ABSTRACT

An object is to provide a transparent conductive film having favorable transparency and conductivity at low cost. Another object is to reduce the resistivity of a transparent conductive film formed using conductive oxynitride including zinc and aluminum. Another object is to provide a transparent conductive film that is formed using conductive oxynitride including zinc and aluminum. When aluminum and nitrogen are made to be included in a transparent conductive film formed using oxide including zinc to form a transparent conductive film that is formed using conductive oxynitride including zinc and aluminum, the transparent conductive film can have reduced resistivity. Heat treatment after the formation of the transparent conductive film that is formed using conductive oxynitride including zinc and aluminum enables reduction in resistivity of the transparent conductive film.

18 Claims, 20 Drawing Sheets

(51) Int. Cl.
*C23C 14/06* (2006.01)
*C23C 14/58* (2006.01)
*C23C 14/54* (2006.01)

(56) References Cited

U.S. PATENT DOCUMENTS

| | | | |
|---|---|---|---|
| 4,843,451 A | 6/1989 | Watanabe et al. | |
| 5,096,505 A | 3/1992 | Fraas et al. | |
| 6,737,123 B2 | 5/2004 | Kondo et al. | |
| 7,699,965 B2 | 4/2010 | Ikisawa et al. | |
| 7,927,713 B2 | 4/2011 | Ye | |
| 8,378,393 B2 | 2/2013 | Sakata et al. | |
| 8,398,826 B2 | 3/2013 | Ye | |
| 2003/0044682 A1* | 3/2003 | Park et al. | 429/223 |
| 2004/0175961 A1* | 9/2004 | Olsen | 438/786 |
| 2005/0145972 A1 | 7/2005 | Fukuda et al. | |
| 2006/0086385 A1 | 4/2006 | Nakano et al. | |
| 2006/0201546 A1 | 9/2006 | Yokoyama | |
| 2006/0283833 A1 | 12/2006 | Lee et al. | |
| 2007/0034251 A1 | 2/2007 | Jonczyk et al. | |
| 2007/0238310 A1* | 10/2007 | Matsuda et al. | 438/758 |
| 2007/0254455 A1* | 11/2007 | Yamaguchi et al. | 438/455 |
| 2008/0012008 A1* | 1/2008 | Song et al. | 257/40 |
| 2008/0295879 A1 | 12/2008 | Atanackovic | |
| 2008/0308143 A1* | 12/2008 | Atanackovic | 136/255 |
| 2009/0007955 A1 | 1/2009 | Nakashima et al. | |
| 2009/0104462 A1* | 4/2009 | Windt | 428/457 |
| 2009/0183774 A1 | 7/2009 | Atanackovic | |
| 2009/0233424 A1* | 9/2009 | Ye | 438/482 |
| 2010/0307559 A1 | 12/2010 | Yamazaki et al. | |
| 2010/0307590 A1 | 12/2010 | Yamazaki et al. | |
| 2011/0003418 A1 | 1/2011 | Sakata et al. | |
| 2011/0048499 A1 | 3/2011 | Myong | |
| 2012/0012166 A1 | 1/2012 | Atanackovic | |
| 2012/0080084 A1 | 4/2012 | Suh et al. | |
| 2013/0146871 A1 | 6/2013 | Ye | |

FOREIGN PATENT DOCUMENTS

| | | |
|---|---|---|
| JP | 62-259480 A | 11/1987 |
| JP | 63-313874 A | 12/1988 |
| JP | 02-073672 A | 3/1990 |
| JP | 2001-028452 A | 1/2001 |
| JP | 2002-241926 A | 8/2002 |
| JP | 2003-347572 A | 12/2003 |
| JP | 2004-260013 A | 9/2004 |
| JP | 2006-120745 A | 5/2006 |
| JP | 2007-238375 A | 9/2007 |
| JP | 2008-053118 A | 3/2008 |
| JP | 2009-035790 A | 2/2009 |
| WO | WO-2007/108266 | 9/2007 |
| WO | WO-2008/134204 | 11/2008 |

OTHER PUBLICATIONS

Lu.J et al., "p-type conduction in N-Al co-doped ZnO thin films,", Applied Physics Letters, Oct. 11, 2004, vol. 85, No. 15, pp. 3134-3135.

* cited by examiner as-depo after heat treatment

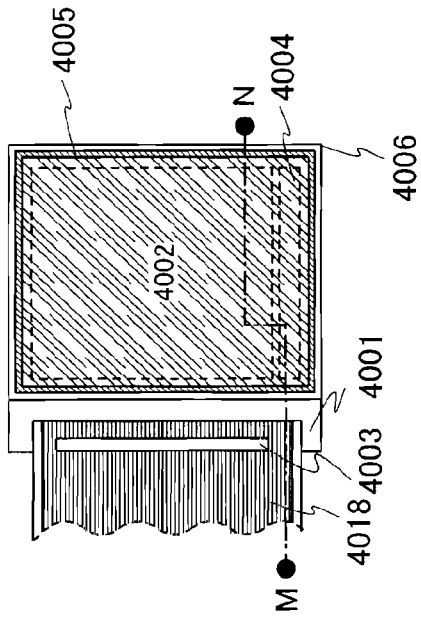
FIG. 10A1
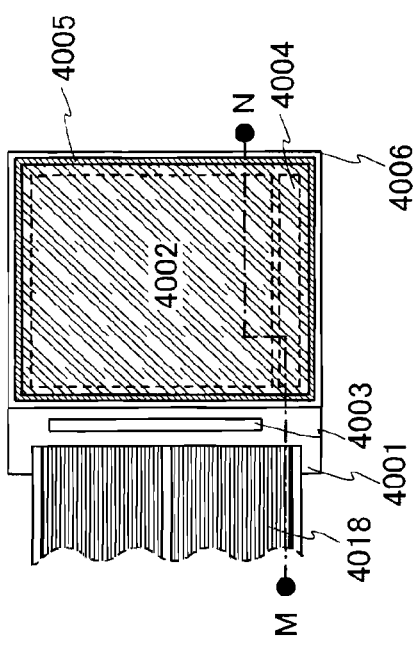
FIG. 10A2
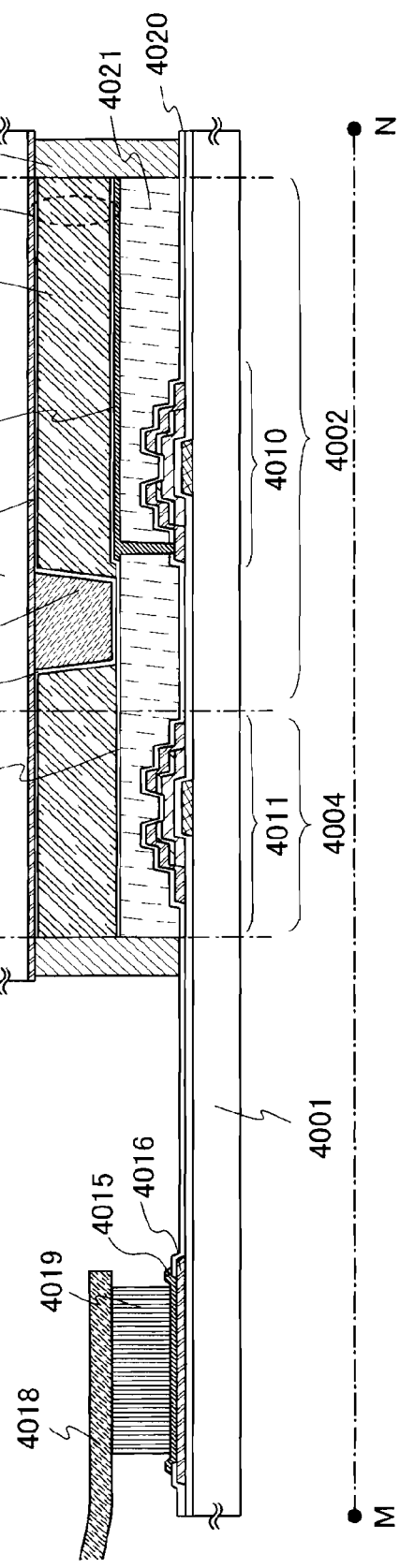
FIG. 10B

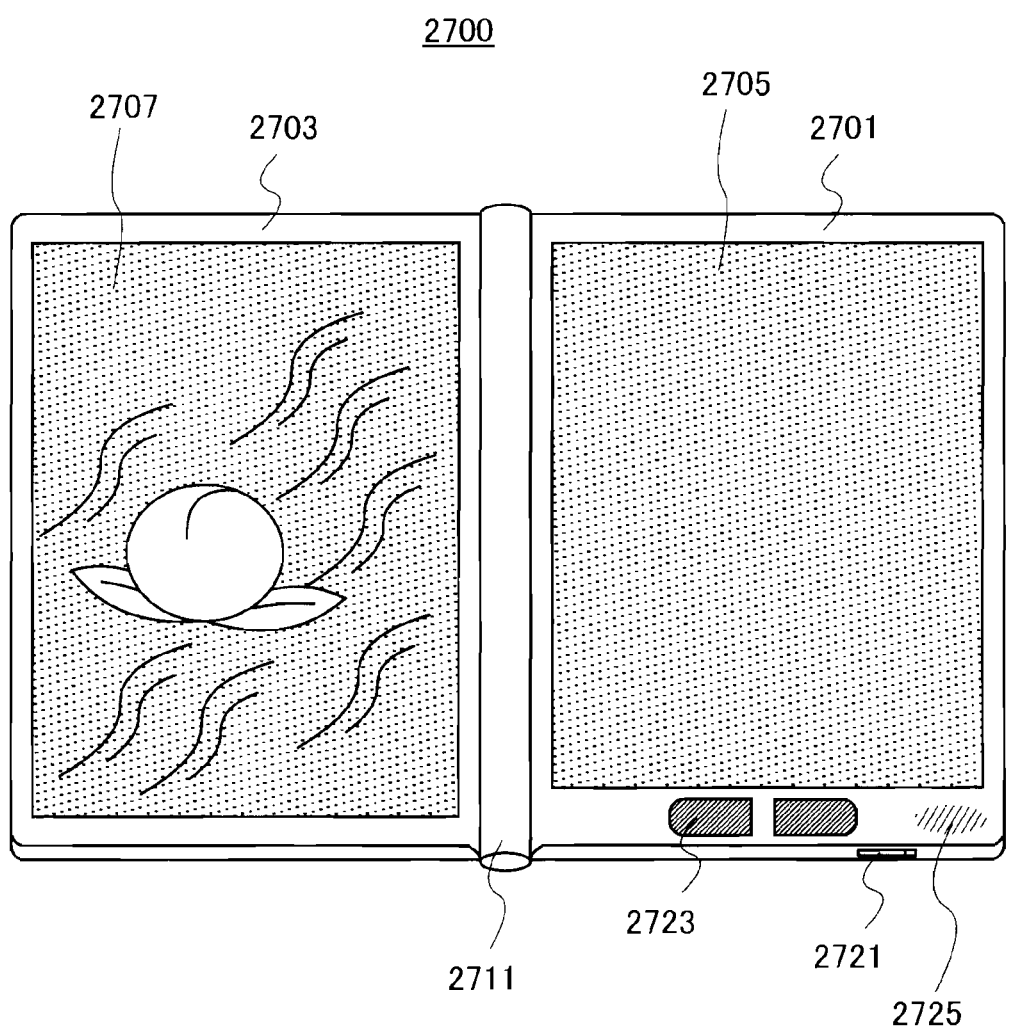

LIGHT-TRANSMITTING CONDUCTIVE FILM, DISPLAY DEVICE, ELECTRONIC DEVICE, AND MANUFACTURING METHOD OF LIGHT-TRANSMITTING CONDUCTIVE FILM

BACKGROUND OF THE INVENTION

1. Field of the Invention

The present invention relates to a light-transmitting conductive film, a display device that uses the light-transmitting conductive film, an electronic device that uses the light-transmitting conductive film, and a manufacturing method of the light-transmitting conductive film. In particular, the present invention relates to a light-transmitting conductive film that is formed using conductive oxynitride including zinc and aluminum, and a manufacturing method of the light-transmitting conductive film.

2. Description of the Related Art

In recent years, liquid crystal display devices, light-emitting display devices, and electrophoretic display devices which are typified by flat panel displays have been actively developed. Most of them have a structure in which a displayed image or display light is seen through a transparent electrode in which transparent conductive oxide is used. As an example of the transparent conductive oxide, an indium oxide-tin oxide compound ($In_2O_3$—$SnO_2$, abbreviated to ITO) film formed using a target obtained by adding tin oxide to indium oxide and performing sintering can be typically given. Having a lower resistivity than transparent conductive oxides using other materials and high transparency in a visible light region, ITO is often used as a transparent electrode in flat panel displays and the like.

However, indium which is a main material of ITO is a rare metal and very expensive and may cause the increase in cost of flat panel displays and the like. Further, indium resources are in danger of depletion, and discovery of an alternative material is desired from the standpoint of environmental protection.

As an alternative transparent conductive oxide to ITO, transparent conductive oxide using zinc oxide (ZnO) can be given. Although transparency and conductivity of ZnO are inferior to those of ITO, ZnO is a very inexpensive material as compared to ITO. For example, the cost of a target formed by sintering ZnO is approximately two thirds to half of the cost of a target formed by sintering ITO. As a method to improve the conductivity of ZnO, a method for forming transparent conductive oxide including a slight amount of aluminum functioning as a donor in ZnO is known (Patent Document 1).

REFERENCE

Patent Document

[Patent Document 1] Japanese Published Patent Application No. 2007-238375

SUMMARY OF THE INVENTION

It is an object of an embodiment of the present invention to provide a transparent conductive film having favorable transparency and conductivity at low cost. Further, another object of an embodiment of the present invention is to reduce the resistivity of a transparent conductive film formed using oxide including zinc. Another object of an embodiment of the present invention is to provide a transparent conductive film that is formed using conductive oxynitride including zinc and aluminum. Furthermore, another object of an embodiment of the present invention is to provide a display device and an electronic device that use the transparent conductive film.

In order to achieve the above-described objects, aluminum and nitrogen are included in a transparent conductive film that is formed using oxide including zinc, that is, a transparent conductive film that is formed using conductive oxynitride including zinc and aluminum is formed. Further, heat treatment is performed on the transparent conductive film that is formed using conductive oxynitride including zinc and aluminum after the film formation.

An embodiment of the present invention is a light-transmitting conductive film which is formed using conductive oxynitride including zinc and aluminum, in which the percentage of zinc in the conductive oxynitride is lower than or equal to 47 atomic %, the percentage of aluminum in the conductive oxynitride is lower than that of zinc and higher than that of nitrogen, and the concentration of nitrogen in the conductive oxynitride is higher than or equal to $5.0 \times 10^{20}$ atoms/cm$^3$.

Another embodiment of the present invention is a light-transmitting conductive film which is formed using oxynitride including zinc and aluminum, in which the percentage of aluminum in the oxynitride is higher than that of nitrogen in the oxynitride, and the carrier density is higher than or equal to $2.2 \times 10^{20}$ cm$^{-3}$ and lower than $4.2 \times 10^{20}$ cm$^{-3}$.

Another embodiment of the present invention is a light-transmitting conductive film which is formed using oxynitride including zinc and aluminum, in which the percentage of aluminum in the oxynitride is higher than that of nitrogen in the oxynitride, and the mobility is higher than or equal to 4.7 cm$^2$/V·sec and lower than 36.0 cm$^2$/V·sec.

Another embodiment of the present invention is a light-transmitting conductive film which is formed using oxynitride including zinc and aluminum, in which the percentage of aluminum in the oxynitride is higher than that of nitrogen in the oxynitride, and the resistivity is higher than $4.1 \times 10^{-4}$ Ω·cm and lower than or equal to $6.1 \times 10^{-3}$ Ω·cm.

Another embodiment of the present invention is a light-transmitting conductive film which is formed using oxynitride including zinc and aluminum, in which the percentage of aluminum in the oxynitride is higher than that of nitrogen in the oxynitride, and the transmissivity with respect to light having a wavelength of 470 nm is higher than or equal to 0.70.

Another embodiment of the present invention is a light-transmitting conductive film which is formed using oxynitride including zinc and aluminum, in which the percentage of aluminum in the oxynitride is higher than that of nitrogen in the oxynitride, and the transmissivity with respect to light having a wavelength of 530 nm is higher than or equal to 0.70.

Another embodiment of the present invention is a light-transmitting conductive film which is formed using oxynitride including zinc and aluminum, in which the percentage of aluminum in the oxynitride is higher than that of nitrogen in the oxynitride, and the transmissivity with respect to light having a wavelength of 680 nm is higher than or equal to 0.70.

The percentage of zinc in the oxynitride is preferably lower than or equal to 47 atomic %. In addition, the concentration of nitrogen in the oxynitride is preferably higher than or equal to $5.0 \times 10^{20}$ atoms/cm$^3$. The oxynitride including zinc and aluminum preferably has at least a polycrystalline structure.

Another embodiment of the present invention is a display device which includes any of the above-described light-transmitting conductive films. Further, another embodiment of the present invention is an electronic device which includes any of the above-described light-transmitting conductive films.

Another embodiment of the present invention is a manufacturing method of a light-transmitting conductive film, which includes the steps of: forming a light-transmitting conductive film that is formed using conductive oxynitride including zinc and aluminum by a sputtering method in an atmosphere including a rare gas; and performing heat treatment on the light-transmitting conductive film.

Another embodiment of the present invention is a manufacturing method of a light-transmitting conductive film, which includes the steps of: forming a light-transmitting conductive film that is formed using conductive oxynitride including zinc and aluminum by a sputtering method in an atmosphere including only a rare gas; and performing heat treatment on the light-transmitting conductive film.

Another embodiment of the present invention is a manufacturing method of a light-transmitting conductive film, which includes the steps of: forming a light-transmitting conductive film that is formed using conductive oxynitride including zinc and aluminum by a sputtering method in an atmosphere including a rare gas and an oxygen gas; and performing heat treatment on the light-transmitting conductive film. The concentration of the oxygen gas is higher than or equal to 0.10%.

In the above-described manufacturing methods of a light-transmitting conductive film, the sputtering method is preferably carried out using a target including zinc oxide and aluminum nitride. Further, the sputtering method is preferably carried out using a target including zinc oxide over which a chip of aluminum nitride is set. In the case where aluminum is included in a target including zinc oxide, the amount of aluminum included in the chip of aluminum nitride is preferably larger than that included in the target including zinc oxide. In addition, the heat treatment is preferably performed under an atmosphere including an inert gas. The heat treatment is preferably performed under a nitrogen atmosphere. The heat treatment is preferably performed at 250° C. to 350° C.

In this specification, the "resistivity" is a value obtained by dividing the resistance value of a sample by the length of the sample and then multiplying the result by the cross-sectional area of the sample. Note that the "resistivity" is different from the "sheet resistance" obtained by dividing the resistance value of a sample by the length of the sample and then multiplying the result by the width of the sample.

In this specification, the transparent conductive film means a conductive film having such a light-transmitting property as to be able to transmit light from a backlight, light generated from a light-emitting element, or reflected light of incident light from external.

In addition, the oxynitride in this specification means a substance which includes more oxygen than nitrogen.

Note that ordinal numbers such as "first" and "second" in this specification are used for convenience. Therefore, they do not denote the order of steps, the stacking order of layers, and particular names which specify the invention.

According to an embodiment of the present invention, a transparent conductive film having favorable transparency and conductivity can be provided at low cost, and the transparent conductive film is formed using conductive oxynitride including zinc and aluminum. According to an embodiment of the present invention, aluminum and nitrogen are included in a transparent conductive film that is formed using oxide including zinc, so that a transparent conductive film that is formed using conductive oxynitride including zinc and aluminum is formed. In this way, the resistivity of the transparent conductive film can be reduced. Further, according to an embodiment of the present invention, heat treatment is performed after the formation of the transparent conductive film that is formed using conductive oxynitride including zinc and aluminum; thus, the resistivity of the transparent conductive film can be reduced.

Further, when the transparent conductive film is used in a pixel portion of a display device, the display device can have low power consumption and high reliability.

BRIEF DESCRIPTION OF THE DRAWINGS

In the accompanying drawings:

FIGS. 10A1 and 10A2 are each a top view of a display device according to an embodiment of the present invention and FIG. 10B is a cross-sectional view of the display device;

FIG. 16 is an external view of an example of an e-book reader;

DETAILED DESCRIPTION OF THE INVENTION

Figure 1A:
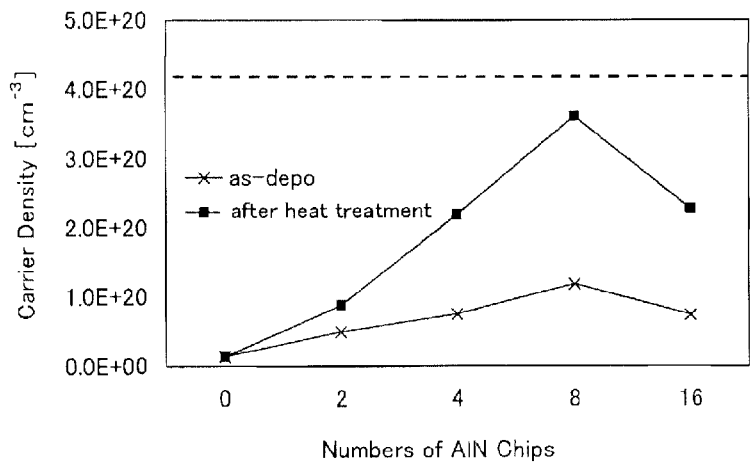
FIGS. 1A to 1C show Hall effect measurement results of transparent conductive films.

Embodiments are described in detail with reference to drawings. The present invention is not limited to the following description, and it is easily understood by those skilled in the art that modes and details of the present invention can be changed in various ways without departing from the spirit and scope of the present invention. Therefore, the present invention is not construed as being limited to description of the embodiments below. Note that in the structures of the invention described below, the same portions or portions having similar functions are denoted by the same reference numerals through different drawings, and description of such portions is not repeated.

Embodiment 1

In this embodiment, a transparent conductive film that is formed using conductive oxynitride including zinc and aluminum will be described in accordance with the manufacturing process.

A substrate over which a transparent conductive film is deposited is not particularly limited as long as it can withstand a process temperature of this manufacturing process. For example, any of the following substrates can be used: non-alkaline glass substrates made of barium borosilicate glass, aluminoborosilicate glass, aluminosilicate glass, or the like by a fusion process or a float process; ceramic substrates; plastic substrates having heat resistance enough to withstand a process temperature of this manufacturing process; and the like. Further, a glass substrate which contains barium oxide (BaO) more than boric oxide ($B_2O_3$) and has a strain point of 730° C. or higher is preferably used. This is because the glass substrate can be prevented from being warped even when heat treatment at a high temperature of approximately 700° C. is performed. Alternatively, a metal substrate such as a stainless steel alloy substrate, which is provided with an insulating film over its surface, may be used.

In addition, in the case where the transparent conductive film described in this embodiment can be used as an electrode material of a thin film element, the transparent conductive film is formed over a protective film or a planarization film formed over a thin film transistor, for example.

Next, a transparent conductive film that is formed using conductive oxynitride including zinc and aluminum is formed over the substrate. The film formation is performed using a sputtering method in an atmosphere including a rare gas such as argon. In particular, when the film formation is performed in an atmosphere including only a rare gas such as argon, resistivity of the transparent conductive film can be reduced more. As a target, a target including zinc oxide and aluminum nitride is preferably used. Alternatively, a chip of aluminum nitride may be set over a target including zinc oxide. In the case where aluminum is included in a target including zinc oxide, the amount of aluminum included in the chip of aluminum nitride is arranged to be larger than that included in the target including zinc oxide. Here, adjustment of the number of chips of aluminum nitride over the target allows the amounts of nitrogen and aluminum in the transparent conductive film to be adjusted easily. In addition, chips of aluminum nitride are preferably set symmetrically with respect to a point. With the chips of aluminum nitride being arranged in this manner, nitrogen and aluminum can be included uniformly in the formed transparent conductive film.

Since the transparent conductive film of this embodiment can be formed without using indium which is a rare metal, the cost of the target can be suppressed to approximately half to two thirds of that of a transparent conductive film formed using an indium oxide-tin oxide compound (ITO). Thus, the cost for forming the transparent conductive film can be reduced.

A sputtering apparatus using a pulse direct current (DC) power supply is preferably employed because powder substances (also referred to as particles or dust) generated at the time of film formation can be reduced and uniform distribution of the thickness can be obtained when using the pulse direct current (DC) power supply. However, in the case where film formation by sputtering is performed using a chip of aluminum nitride set over a target including zinc oxide, a radio frequency (RF) power supply is preferably employed because aluminum nitride does not have conductivity.

Alternatively, film formation may be performed under an atmosphere including an oxygen gas in addition to a rare gas such as argon; in this case, transmissivity of the transparent conductive film can be improved. However, the resistivity of the transparent conductive film formed under an atmosphere including an oxygen gas is increased. The concentration of the oxygen gas is preferably 0.10% or more.

For example, chips of aluminum nitride (10 mm×10 mm×1 mm) are set symmetrically with respect to a point, over a target with a diameter of 6 inches which is made by sintering zinc oxide and aluminum nitride (ZnO:AlN=100:1 (mol)). Then, film formation is performed under the following conditions: the distance between the substrate and the target is 185 mm, the pressure is 0.4 Pa, the radio frequency (RF) power supply is 0.5 kW, the temperature is room temperature, and the atmosphere is an argon atmosphere. The thickness of the transparent conductive film is preferably 50 nm to 500 nm approximately. The thickness of the transparent conductive film in this embodiment is 100 nm.

In the above-described manner, the transparent conductive film that is formed using conductive oxynitride including zinc and aluminum can be formed. Here, the conductive oxynitride including zinc and aluminum may be a compound including zinc, aluminum, oxygen, and nitrogen or a mixture including zinc, aluminum, oxygen, and nitrogen.

The carrier density of the transparent conductive film formed here is preferably $1.0\times10^{20}$ cm$^{-3}$ to $2.0\times10^{21}$ cm$^{-3}$, and more preferably $2.2\times10^{20}$ cm$^{-3}$ or higher and lower than $4.2\times10^{20}$ cm$^{-3}$. In addition, the mobility of the transparent conductive film is preferably 4.0 cm$^2$/V·sec to 60 cm$^2$/V·sec, and more preferably 4.7 cm$^2$/V·sec or higher and lower than 36.0 cm$^2$/V·sec. Further, the resistivity of the formed transparent conductive film is preferably $1.0\times10^{-4}$ Ω·cm to $1.0\times10^{-2}$ Ω·cm, and more preferably higher than $4.1\times10^{-4}$ Ω·cm and lower than or equal to $6.1\times10^{-3}$ Ω·cm. The transparent conductive film of this embodiment satisfies at least one of the above-mentioned conditions.

The transmissivity of the transparent conductive film formed having a thickness of approximately 100 nm with respect to blue light having a wavelength of 470 nm is preferably 0.70 or higher, and more preferably 0.75 or higher. Further, the transmissivity of the transparent conductive film formed having a thickness of approximately 100 nm with respect to green light having a wavelength of 530 nm is preferably 0.70 or higher, and more preferably 0.75 or higher. Furthermore, the transmissivity of the transparent conductive film formed having a thickness of approximately 100 nm with respect to red light having a wavelength of 680 nm is preferably 0.70 or higher, and more preferably 0.75 or higher. The transparent conductive film of this embodiment satisfies at least one of the above-mentioned conditions.

Further, the transparent conductive film preferably includes nitrogen at a concentration of $5.0\times10^{20}$ atoms/cm$^3$ or more. The concentration of nitrogen is measured by analysis using secondary ion mass spectrometry (SIMS).

The percentage of zinc (atomic %) in the transparent conductive film is lower than or equal to 47 atomic % and higher than that of aluminum in the transparent conductive film. In addition, the percentage of aluminum (atomic %) in the transparent conductive film is higher than that of nitrogen in the transparent conductive film. Further, the transparent conductive film preferably includes aluminum and nitrogen at a percentage of 1.0 atomic % to 8.0 atomic %, and a percentage of 0.5 atomic % to 4.0 atomic %, respectively. Note that the unit of a percentage of an atom (atomic ratio) in the transparent conductive film is atomic percent and the percentage is evaluated by analysis using an electron probe X-ray microanalyzer (EPMA). Note that the term "ratio" may be used instead of the term "percentage" in this specification. The transparent conductive film formed having the above-described composition can have reduced resistivity.

The formed conductive oxynitride including zinc and aluminum at least has a polycrystalline structure. Note that the crystal state of the transparent conductive film is evaluated by analysis using X-ray diffraction (XRD).

When nitrogen is made to be included at the time of film formation by sputtering, oxygen in the transparent conductive film can be reduced and oxygen vacancies can be formed. Accordingly, carriers due to the oxygen vacancies are generated in the conductive oxynitride including zinc and aluminum. Thus, resistivity of the transparent conductive film can be reduced.

Further, when aluminum is made to be included at the time of film formation by sputtering, zinc of the zinc oxide is substituted with aluminum, which allows aluminum to function as a donor in the conductive oxynitride including zinc and aluminum. Accordingly, resistivity of the transparent conductive film can be reduced.

Next, the substrate over which the transparent conductive film that is formed using conductive oxynitride including zinc and aluminum is formed is subjected to heat treatment at 200° C. to 450° C., preferably 250° C. to 350° C. This heat treatment is preferably performed under an atmosphere including an inert gas. Here, the heat treatment is performed at 300° C. for 1 hour under a nitrogen atmosphere. The heat treatment under a nitrogen atmosphere here is effective in reducing resistivity. The atmosphere during the heat treatment may be an air atmosphere, an oxygen atmosphere, or an atmosphere including hydrogen, without limitation to the nitrogen atmosphere.

This heat treatment causes rearrangement of the conductive oxynitride including zinc and aluminum at the atomic level, thereby reducing distortion in the crystal structure that interrupts carrier movement. Accordingly, mobility of the transparent conductive film is improved and resistivity thereof can be reduced. In addition, the heat treatment causes aluminum that has existed between crystal lattices in the conductive oxynitride to move into the crystal lattices and function as a donor. Accordingly, carrier density in the transparent conductive film is increased, and resistivity thereof can be reduced.

Further, reduction of distortion in the crystal structure of the conductive oxynitride including zinc and aluminum, which is resulted from the heat treatment, improves transmissivity of the transparent conductive film. Thus, a transparent conductive film having favorable transparency and conductivity can be formed through heat treatment after film formation.

The timing of the heat treatment is not particularly limited as long as it is after the formation of the transparent conductive film. For example, the heat treatment may be performed after microfabrication by etching.

Then, a resist mask is formed over the formed transparent conductive film using a photomask, and an unnecessary portion of the transparent conductive film that is formed using conductive oxynitride including zinc and aluminum is removed by etching, so that a transparent conductive layer is formed. Etching of the transparent conductive film that is formed using conductive oxynitride including zinc and aluminum may be dry etching without limitation to wet etching.

Here, wet etching is performed using ITO07N (produced by KANTO CHEMICAL CO., INC.) to remove an unnecessary portion of the transparent conductive film that is formed using conductive oxynitride including zinc and aluminum, thereby forming a transparent conductive layer. Through the above-described process, the transparent conductive layer can be formed.

Next, the principle of the reduction in resistivity of the transparent conductive film that is formed using conductive oxynitride including zinc and aluminum will be described using the first-principles calculation based on the density functional theory. Note that CASTEP, software of first-principles calculation produced by Accelrys Software Inc., was used for the first-principles calculation. In addition, GGA-PBE was used for a functional, and an ultrasoft type was used for pseudopotential.

First, the electron density of states of ZnO:Al that is obtained by substitution of Al for the Zn site of the single-crystal ZnO was calculated, and the effect of aluminum (Al) included in single-crystal zinc oxide (ZnO) was researched.

In this calculation, single-crystal ZnO having Al substituted for the Zn site was used as the ZnO:Al structure, where the numbers of atoms of Zn, O, and Al were 35, 36, and 1, respectively. The lattice constant was fixed to the calculated value of the single-crystal ZnO. The ZnO:Al having such a structure was subjected to structure optimization in terms of atomic positions, and the electron density of states of ZnO:Al was calculated. The cut-off energy at this time was set at 380 eV.

Figure 9:
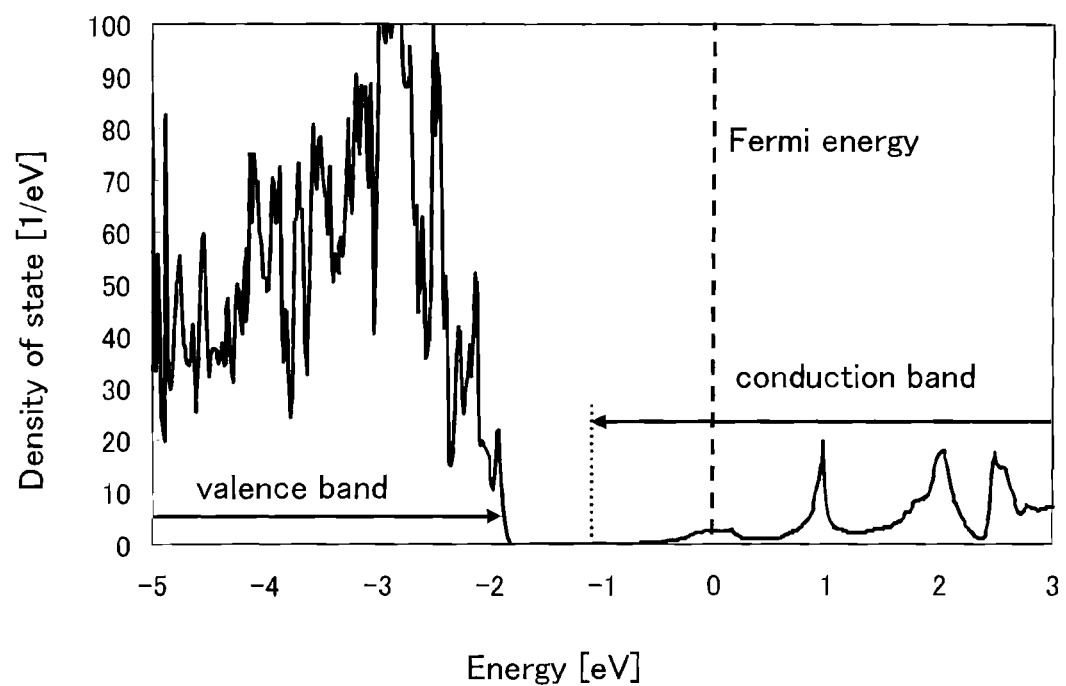
FIG. 9 shows the electron density of states of ZnO:Al obtained from simulation.

The results of the electron density of states calculation is shown in FIG. 9. In FIG. 9, the vertical axis indicates the density of states [1/eV] and the horizontal axis indicates energy [eV]. The Fermi energy is at the origin of the energy, which is indicated on the horizontal axis. As shown in FIG. 9, the top of a valence band of ZnO:Al is −1.81 eV and the bottom of a conduction band thereof is −1.09 eV. The value of the band gap is very small as compared to 3.4 eV which is an experimental value of ZnO. However, it is well known that the band gap is smaller than the experimental value in the first-principles calculation based on the density functional theory, and the value of the band gap does not indicate that this calculation is improper. The Fermi energy is located above the bottom of the conduction band in FIG. 9. Therefore, an electron can exist in the conduction band of ZnO:Al having Al substituted for the Zn site of the single-crystal ZnO, so that it was found that Al functions as a donor and n-type carriers are generated. Accordingly, it was found that inclusion of Al in ZnO enables reduction in resistivity.

In the case of forming ZnO:Al having Al substituted for the Zn site, the film is formed by sputtering using a ZnO—$Al_2O_3$ compound target or a ZnO—AlN compound target. Next, it was examined which of the ZnO—$Al_2O_3$ compound target or the ZnO—AlN compound target form ZnO:Al more easily. For Al in $Al_2O_3$ or in AlN being substituted for the Zn site of single-crystal ZnO, bonding of $Al_2O_3$ or AlN need to be cut by sputtered particles to produce Al isolated atoms in sputtering. Therefore, cohesive energies per Al atom of AlN and $Al_2O_3$ were evaluated. The cohesive energies per Al atom are expressed in Formula (1) and Formula (2) with reaction formula.

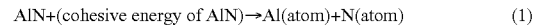

$$\text{AlN} + (\text{cohesive energy of AlN}) \rightarrow \text{Al(atom)} + \text{N(atom)} \quad (1)$$

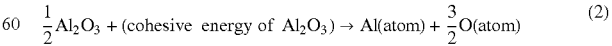

$$\frac{1}{2}Al_2O_3 + (\text{cohesive energy of } Al_2O_3) \rightarrow \text{Al(atom)} + \frac{3}{2}\text{O(atom)} \quad (2)$$

Energies after structural relaxation of each term in Formula (1) and Formula (2) were obtained using the first-principles calculation, and from the sum and remainder of the energies, respective cohesive energies were calculated. The cut-off energy at this time was set at 420 eV.

The above-described calculation showed that the cohesive energy per Al atom of $Al_2O_3$ was 15.3 eV, the cohesive energy per Al atom of AlN was 11.3 eV, and the cohesive energy per Al atom of AlN was lower than that of $Al_2O_3$. Accordingly, it turned out that in the case of performing film formation using sputtering to make Al included in ZnO, bonding of Al in AlN is more easily cut and Al of AlN is more easily substituted for the Zn site of ZnO, as compared to the case of $Al_2O_3$.

In the case where the ZnO—AlN compound is used as a target for formation of ZnO:Al having Al substituted for the Zn site, N is also included in ZnO:Al in addition to Al. At this time, if an excessive amount of N is introduced, there is a possibility that N is substituted for O, functions as an acceptor, and hinders Al from generating n-type carriers. Last, Al and N were compared in ease of being substituted in single-crystal ZnO. Here, reaction energy (hereinafter referred to as substitution energy) at the time of substituting Al for the Zn site of ZnO and substitution energy at the time of substituting N for the O site of ZnO were calculated and compared. The respective substitution energies are expressed in Formula (3) and Formula (4) with reaction formula.

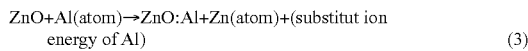

ZnO+Al(atom)→ZnO:Al+Zn(atom)+(substitut ion energy of Al)  (3)

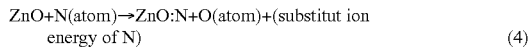

ZnO+N(atom)→ZnO:N+O(atom)+(substitut ion energy of N)  (4)

In the above definition of the substitution energies, higher substitution energy is more likely to cause substitution. Energies after structural relaxation of each term in Formula (3) and Formula (4) were obtained using the first-principles calculation, and from the sum and remainder of the energies, respective substitution energies were calculated. The cut-off energy at this time was set at 420 eV.

The above-described calculation showed that the substitution energy of Al was 5.54 eV, the substitution energy of N was −2.49 eV, and the substitution energy in the case of substituting Al for the Zn site of ZnO was higher than that in the case of substituting N for the O site of ZnO. Accordingly, it turned out that Al is more likely to be introduced into single-crystal Zn as compared to N. It is notable that the two substitution energies have different signs, which indicates that the substitution of N is unlikely to be caused as compared to the substation of Al. Therefore, the function of Al as a donor is not hindered by N.

From the above-described calculation, it was found that inclusion of Al in ZnO enables reduction in resistivity, Al can be effectively included in the case of using a target including AlN and, in this case, N does not hinder the function of Al as a donor. When a transparent conductive film is formed using conductive oxynitride including zinc and aluminum, the transparent conductive film having low resistivity can be efficiently formed.

In the above-described manner, a transparent conductive film having favorable transparency and conductivity, which is formed using conductive oxynitride including zinc and aluminum, can be provided at low cost. Further, when aluminum and nitrogen are included in a transparent conductive film formed using oxide including zinc, a transparent conductive film that is formed using conductive oxynitride including zinc and aluminum is formed, and thus the transparent conductive film can have reduced resistivity. Furthermore, when heat treatment is performed after formation of the transparent conductive film that is formed using conductive oxynitride including zinc and aluminum, the resistivity of the transparent conductive film can be reduced.

Note that the structure described in this embodiment can be combined with any of the structures described in the other embodiments as appropriate.

Embodiment 2

In this embodiment, the case will be described in which a liquid crystal display device is manufactured by applying a so-called active matrix substrate in which a pixel electrode is formed using a transparent conductive film that is formed using conductive oxynitride including zinc and aluminum according to Embodiment 1 and a pixel portion and a driver circuit are formed over one substrate by using thin film transistors.

The display device includes a display element. As the display element, a liquid crystal element (also referred to as a liquid crystal display element) or a light-emitting element (also referred to as a light-emitting display element) can be used. Light-emitting elements include, in its category, an element whose luminance is controlled by a current or a voltage, and specifically include an inorganic electroluminescent (EL) element, an organic EL element, and the like. Furthermore, a display medium whose contrast is changed by an electric effect, such as an electronic ink, can be used.

In addition, the display device includes a panel in which the display element is sealed, and a module in which an IC or the like including a controller is mounted on the panel. An embodiment of the present invention also relates to an element substrate, which corresponds to one mode before the display element is completed in a manufacturing process of the display device, and the element substrate is provided with means for supplying a current to the display element in each of a plurality of pixels. Specifically, the element substrate may be in a state after only a pixel electrode of the display element is formed, a state after a conductive film to be a pixel electrode is formed and before the conductive film is etched to form the pixel electrode, or any of the other states.

Note that a display device in this specification means an image display device, a display device, or a light source (including a lighting device). Furthermore, the display device also includes the following modules in its category: a module to which a connector such as a flexible printed circuit (FPC), a tape automated bonding (TAB) tape, or a tape carrier package (TCP) is attached; a module having a TAB tape or a TCP at the tip of which a printed wiring board is provided; and a module in which an integrated circuit (IC) is directly mounted on a display element by a chip on glass (COG) method.

In this embodiment, the appearance and the cross section of a liquid crystal display panel including an embodiment of a conductive layer formed using conductive oxynitride will be described with reference to FIGS. 10A1, 10A2, and 10B. FIGS. 10A1 and 10A2 are each a top view of a panel in which a liquid crystal material is sealed between a second substrate 4006 and a pixel electrode layer 4030 connected to a source or drain electrode layer of a thin film transistor 4010 formed over a first substrate 4001 with a sealant 4005. FIG. 10B is a cross-sectional view taken along line M-N of FIGS. 10A1 and 10A2.

The sealant 4005 is provided to surround a pixel portion 4002 and a scan line driver circuit 4004 that are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a non-single-crystal semiconductor film over a substrate separately prepared is mounted in a region different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 10A1 illustrates an example of mounting the signal line driver circuit 4003 by a COG method, and FIG. 10A2 illustrates an example of mounting the signal line driver circuit 4003 by a TAB method.

The pixel portion 4002 and the scan line driver circuit 4004 provided over the first substrate 4001 each include a plurality of thin film transistors. FIG. 10B illustrates, as an example, the thin film transistor 4010 included in the pixel portion 4002 and the thin film transistor 4011 included in the scan line driver circuit 4004. Insulating layers 4020 and 4021 are provided over the thin film transistors 4010 and 4011.

As the thin film transistors 4010 and 4011, thin film transistors each including amorphous silicon, low-temperature polysilicon, or an oxide semiconductor containing indium, gallium, and zinc for a channel formation layer may be employed. In this embodiment, the thin film transistors 4010 and 4011 are n-channel thin film transistors.

The pixel electrode layer 4030 included in the liquid crystal element 4013 is formed using a transparent conductive film that is formed using conductive oxynitride including zinc and aluminum. Further, a transparent conductive film that is formed using conductive oxynitride including zinc and aluminum may be used for a counter electrode layer 4031 included in the liquid crystal element 4013. The pixel electrode layer 4030 is electrically connected to the thin film transistor 4010. The counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 interposed therebetween.

Note that the first substrate 4001 and the second substrate 4006 can be made of glass, metal (typically, stainless steel), ceramic, or plastic. As plastic, a fiberglass-reinforced plastics (FRP) plate, a polyvinyl fluoride (PVF) film, a polyester film, or an acrylic resin film can be used. Alternatively, a sheet with a structure in which an aluminum foil is sandwiched between PVF films or polyester films may be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used. The counter electrode layer 4031 is electrically connected to a common potential line provided over the same substrate as the thin film transistor 4010, through conductive particles. Note that the conductive particles are contained in the sealant 4005.

Further, a liquid crystal exhibiting a blue phase for which an alignment film is unnecessary may be used. The blue phase is one of liquid crystal phases, which appears just before a cholesteric phase changes into an isotropic phase while the temperature of a cholesteric liquid crystal is increased. Since the blue phase only appears within a narrow range of temperature, a liquid crystal composition in which a chiral agent is mixed at 5 wt % or more in order to improve the temperature range is used for the liquid crystal layer 4008. The liquid crystal composition which includes a liquid crystal exhibiting a blue phase and a chiral agent has a short response time of 10 μs to 100 μs and are optically isotropic; therefore, alignment treatment is unnecessary and viewing angle dependence is small.

Although an example of a transmissive liquid crystal display device is described in this embodiment, the conductive oxynitride described in the above embodiment can be used in a reflective liquid crystal display device or a transflective liquid crystal display device.

In this embodiment, an example of the liquid crystal display device is described in which a polarizing plate is provided on the outer surface of the substrate (on the viewer side) and a coloring layer and an electrode layer used for a display element are provided on the inner surface of the substrate in this order; however, the polarizing plate may be provided on the inner surface of the substrate. The layered structure of the polarizing plate and the coloring layer is not limited to that described in this embodiment and may be set as appropriate depending on materials of the polarizing plate and the coloring layer or conditions of manufacturing process. Furthermore, a light-blocking film serving as a black matrix may be provided.

In this embodiment, in order to reduce the surface roughness of the thin film transistor and to improve the reliability of the thin film transistor, the thin film transistor is covered with the insulating layers (the insulating layer 4020 and the insulating layer 4021) serving as a protective film or a planarizing insulating film. Note that the protective film is provided to prevent entry of contaminating impurities floating in the air, such as an organic substance, a metal substance, or water vapor, and is preferably a dense film. The protective film may be formed by a sputtering method to have a single-layer structure of a silicon oxide film, a silicon nitride film, a silicon oxynitride film, a silicon nitride oxide film, an aluminum oxide film, an aluminum nitride film, an aluminum oxynitride film, or an aluminum nitride oxide film, or a layered structure including any of the above films. Although this embodiment describes an example of forming the protective film by a sputtering method, the present invention is not limited to this method and any of a variety of methods may be employed.

In this embodiment, the insulating layer 4020 having a layered structure is formed as the protective film. As a first layer of the insulating layer 4020, a silicon oxide film is formed by a sputtering method. The use of the silicon oxide film as the protective film has an effect of preventing a hillock of an aluminum film used for the source and drain electrode layers.

Another insulating layer is also formed as a second layer of the protective film. In this embodiment, as a second layer of the insulating layer 4020, a silicon nitride film is formed by a sputtering method. The use of the silicon nitride film as the protective film can prevent mobile ions such as sodium ions from entering a semiconductor region, thereby suppressing variations in electrical characteristics of the TFT.

The insulating layer 4021 is formed as the planarizing insulating film. For the insulating layer 4021, an organic material having heat resistance, such as polyimide, acrylic, benzocyclobutene, polyamide, or epoxy, can be used. Alternatively, a low-dielectric constant material (a low-k material), a siloxane-based resin, PSG (phosphosilicate glass), BPSG (borophosphosilicate glass), or the like may be used. A siloxane-based resin may include, as a substituent, an organic group (e.g., an alkyl group or an aryl group) or a fluoro group.

Note that the insulating layer 4021 may be formed by stacking a plurality of insulating films formed using these materials.

Note that the siloxane-based resin corresponds to a resin formed from a siloxane-based material as a starting material and having the bond of Si—O—Si.

There is no particular limitation on the method for forming the insulating layer 4021, and the insulating layer 4021 can be formed, depending on the material, by a method such as a sputtering method, an SOG method, spin coating, dipping, spray coating, or a droplet discharge method (e.g., an ink-jet method, screen printing, or offset printing), or with a tool (equipment) such as a doctor knife, a roll coater, a curtain coater, or a knife coater.

The pixel electrode layer 4030 is formed using a transparent conductive film that is formed using conductive oxynitride including zinc and aluminum by the method described in Embodiment 1.

The counter electrode layer 4031 can be formed using a transparent conductive film that is formed using conductive oxynitride including zinc and aluminum or a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

A conductive composition containing a conductive macromolecule (also referred to as a conductive polymer) can be used to form the counter electrode layer 4031.

As the conductive macromolecule, a so-called π-electron conjugated conductive macromolecule can be used. For example, it is possible to use polyaniline or a derivative thereof, polypyrrole or a derivative thereof, polythiophene or a derivative thereof, or a copolymer of two or more kinds of them.

In addition, a variety of signals and a potential are supplied to the signal line driver circuit 4003 that is formed separately, the scan line driver circuit 4004, and the pixel portion 4002 from an FPC 4018.

In this embodiment, a connecting terminal electrode 4015 is formed using the same conductive film as that of the pixel electrode layer 4030 included in the liquid crystal element 4013, and a terminal electrode 4016 is formed using the same conductive film as that of source and drain electrode layers of the thin film transistors 4010 and 4011.

The connecting terminal electrode 4015 is electrically connected to a terminal included in the FPC 4018 through an anisotropic conductive film 4019.

FIGS. 10A1, 10A2, and 10B illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 11:
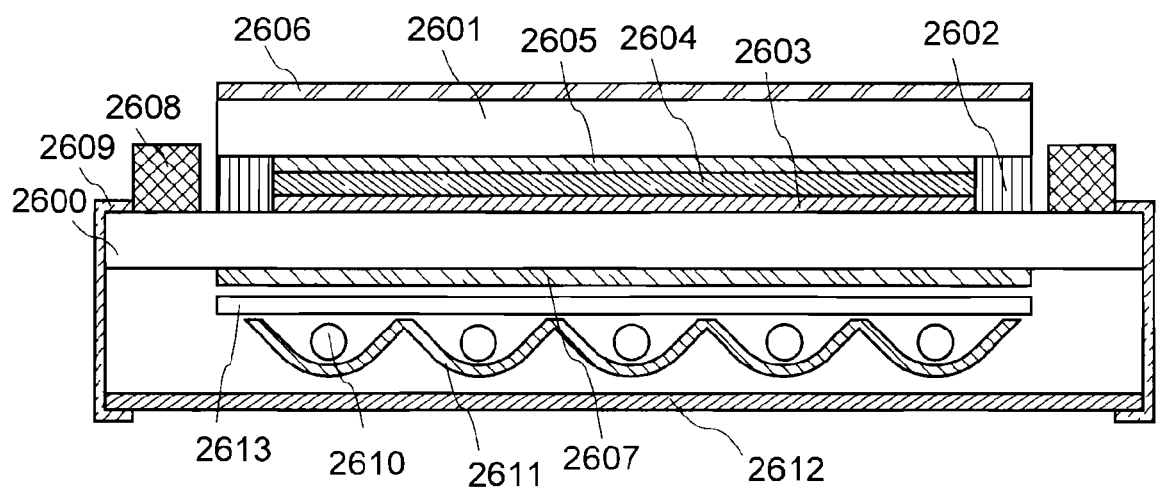
FIG. 11 is a cross-sectional view of a display device according to an embodiment of the present invention.

FIG. 11 illustrates an example of a liquid crystal display module which is formed as a semiconductor device by using a TFT substrate 2600 manufactured using a transparent conductive film that is formed using conductive oxynitride including zinc and aluminum.

FIG. 11 illustrates an example of a liquid crystal display module, in which the TFT substrate 2600 and a counter substrate 2601 are bonded to each other with a sealant 2602, and a pixel portion 2603 including a pixel electrode formed using a transparent conductive film that is formed using conductive oxynitride including zinc and aluminum and the like, a display element 2604 including a liquid crystal layer, a coloring layer 2605, and a polarizing plate 2606 are provided between the substrates to form a display region. The coloring layer 2605 is necessary to perform color display. In the case of the RGB system, respective coloring layers corresponding to colors of red, green, and blue are provided for respective pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609 and includes an external circuit such as a control circuit or a power source circuit. The polarizing plate and the liquid crystal layer may be stacked with a retardation plate interposed therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (antiferroelectric liquid crystal) mode, or the like can be used.

Through the above-described process, a liquid crystal display panel can be manufactured. The pixel electrode of the liquid crystal display panel of this embodiment is formed using a transparent conductive film that is formed using conductive oxynitride including zinc and aluminum. Thus, the transparent conductive film can be formed without using indium, which leads to cost reduction of the transparent conductive film and the light-emitting device. In addition, since the transparent conductive film that is formed using conductive oxynitride including zinc and aluminum has reduced resistivity, the liquid crystal display panel with low power consumption and high reliability can be manufactured.

Note that the structure described in this embodiment can be combined with any of the structures described in the other embodiments as appropriate.

Embodiment 3

Figure 12A:
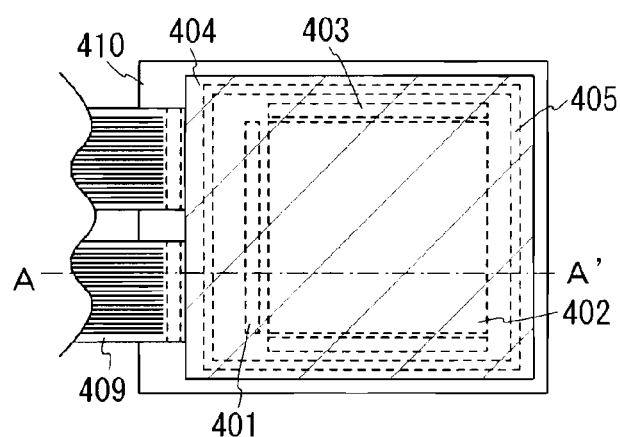
FIGS. 12A and 12B illustrate a light-emitting device according to an embodiment of the present invention.
Figure 12B:
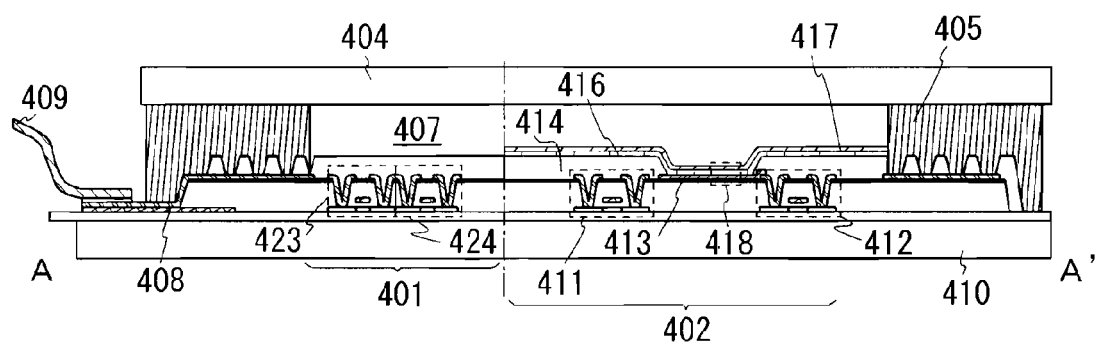

In this embodiment, a light-emitting device including a pixel electrode using a transparent conductive film that is formed using conductive oxynitride including zinc and aluminum will be described with reference to FIGS. 12A and 12B. Note that FIG. 12A is a top view of the light-emitting device, and FIG. 12B is a cross-sectional view taken along line A-A' of FIG. 12A. Reference numerals 401, 402, and 403 denote a driver circuit portion (a source driver circuit), a pixel portion, and a driver circuit portion (a gate driver circuit), respectively, which are indicated by dotted lines. Further, reference numeral 404 denotes a sealing substrate and reference numeral 405 denotes a sealant. A portion surrounded by the sealant 405 is a space 407.

Note that a lead wiring 408 is a wiring for transmitting signals to be input into the source driver circuit 401 and the gate driver circuit 403 and for receiving signals such as a video signal, a clock signal, a start signal, and a reset signal from an FPC (flexible printed circuit) 409 serving as an external input terminal. Although only the FPC is illustrated here, this FPC may be provided with a printed wiring board (PWB). The light-emitting device in this specification refers to not just a light-emitting device itself but a light-emitting device provided with an FPC or a PWB.

Next, a cross-sectional structure will be described with reference to FIG. 12B. Among the driver circuit portions and the pixel portion including a plurality of pixels, which are formed over a substrate 410, the source driver circuit 401 which is a driver circuit portion, and one of the plurality of pixels in the pixel portion 402 are illustrated here.

Note that a CMOS circuit in which an n-channel TFT 423 and a p-channel TFT 424 are formed in combination is formed in the source driver circuit 401. The driver circuit may be formed using a variety of circuits including a TFT, such as a CMOS circuit, a PMOS circuit, or a NMOS circuit. Although the driver integrated device which has the driver circuit formed over the substrate is described in this embodiment, the driver circuit is not necessarily formed over the substrate. It is also possible to form the driver circuit not over the substrate but outside the substrate.

Moreover, the pixel portion 402 includes a plurality of pixels including a switching TFT 411, a current control TFT 412, and a first electrode 413 electrically connected to a drain of the current control TFT 412. Note that an insulator 414 is formed covering an end portion of the first electrode 413. Here, a positive photosensitive acrylic resin film is used for the insulator 414.

In order to improve the coverage, the insulator 414 is formed to have a curved surface with a curvature at its upper or lower end portion. For example, in the case of using positive photosensitive acrylic as a material of the insulator 414, only the upper end portion of the insulator 414 preferably has a curved surface with a radius of curvature (0.2 μm to 3 μm). Further, the insulator 414 can be formed using either a negative type that becomes insoluble in an etchant by light irradiation or a positive type that becomes soluble in an etchant by light irradiation.

The first electrode 413 serving as a pixel electrode is formed using the transparent conductive film that is formed using conductive oxynitride including zinc and aluminum described in Embodiment 1. A layer 416 containing a light-emitting substance and a second electrode 417 are formed over the first electrode 413. The layer 416 containing a light-emitting substance can be formed by an evaporation method using an evaporation mask or a wet process such as an inkjet method or a spin coating method.

Although the layer 416 containing a light-emitting substance is generally formed to have a single-layer structure or a layered structure of an organic compound, in the present invention, the layer 416 containing a light-emitting substance may have a structure in which an inorganic compound is used for part of a film formed using an organic compound. Further, to facilitate injection of holes from the first electrode 413 to the layer 416 containing a light-emitting substance, a hole injection layer may be provided between the first electrode 413 and the layer 416 containing a light-emitting substance.

Further, as a material used for the second electrode 417, which is formed over the layer 416 containing a light-emitting substance, a material having a low work function (Al, Ag, Li, Ca, or an alloy or compound thereof such as MgAg, MgIn, AlLi, $CaF_2$, or $Ca_3N_2$) is preferably used. In the case where light generated from the layer 416 containing a light-emitting substance is transmitted through the second electrode 417 functioning as a cathode, the second electrode 417 is preferably formed using a stack of a thin metal film having a reduced thickness and a transparent conductive film (such as an indium oxide-tin oxide compound (ITO), an indium oxide-zinc oxide compound ($In_2O_3$—ZnO), or zinc oxide (ZnO)) or a stack of a thin metal film having a thinned thickness and a transparent conductive film that is formed using conductive oxynitride including zinc and aluminum.

By attaching the sealing substrate 404 to the substrate 410 with the sealant 405, a light-emitting element 418 is provided in the space 407 which is surrounded by the substrate 410, the sealing substrate 404, and the sealant 405. Note that the space 407 may be filled with an inert gas (e.g., nitrogen or argon) or the sealant 405.

Note that an epoxy-based resin is preferably used for the sealant 405. In addition, it is desirable to use a material that allows permeation of moisture or oxygen as little as possible. As the sealing substrate 404, a glass substrate, a quartz substrate, or a plastic substrate formed from fiberglass-reinforced plastics (FRP), polyvinyl fluoride (PVF), polyester, an acrylic resin, or the like can be used.

In the light-emitting device of this embodiment, the transparent conductive film that is formed using conductive oxynitride including zinc and aluminum is used for a pixel electrode. Thus, the transparent conductive film can be formed without using indium, which can lead to cost reduction of the transparent conductive film and the light-emitting device. In addition, since the transparent conductive film has reduced resistivity, the light-emitting device with low power consumption and high reliability can be manufactured.

Figure 13A:
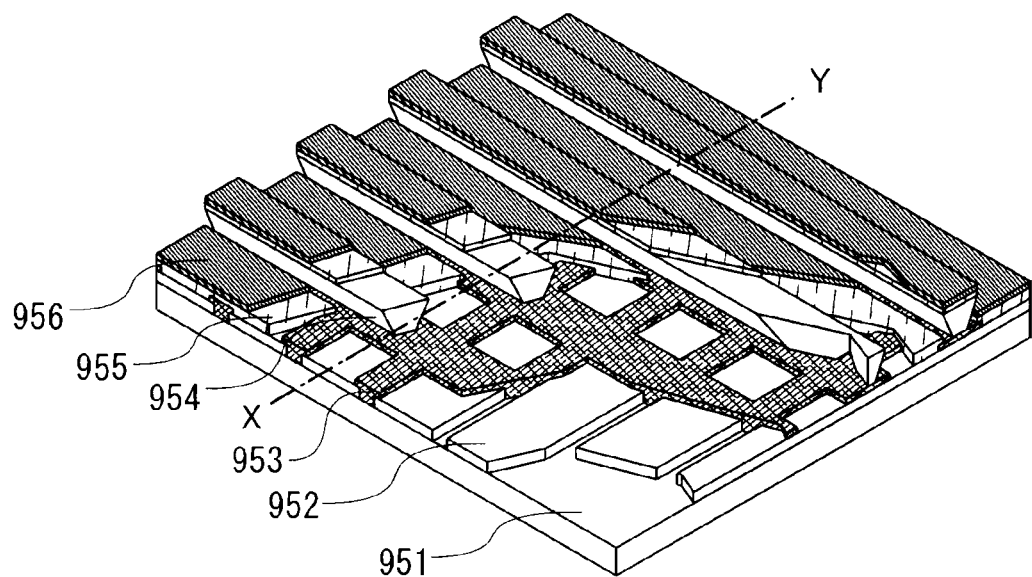
FIGS. 13A and 13B illustrate a light-emitting device according to an embodiment of the present invention.
Figure 13B:
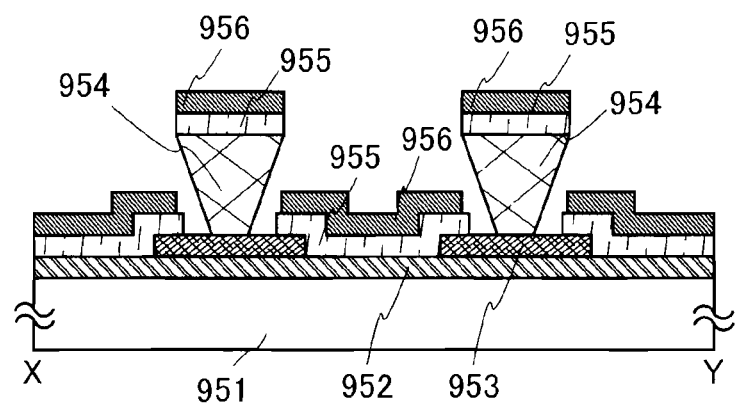

Although an active matrix image display device in which driving of a light-emitting element is controlled with a transistor is described in this embodiment, a passive matrix image display device may be formed. FIGS. 13A and 13B illustrate a passive matrix image display device manufactured by applying an embodiment of the present invention. Note that FIG. 13A is a perspective view of a passive matrix image display device, and FIG. 13B is a cross-sectional view taken along line X-Y of FIG. 13A. In FIGS. 13A and 13B, an electrode 952 serving as a pixel electrode is formed over a substrate 951 with the use of a transparent conductive film that is formed using conductive oxynitride including zinc and aluminum, and an electrode 956 is provided over the electrode 952 with a layer 955 containing a light-emitting substance interposed therebetween. An edge portion of the electrode 952 is covered with an insulating layer 953. A partition layer 954 is provided over the insulating layer 953.

The sidewalls of the partition layer 954 are aslope so that the distance between the sidewalls is gradually reduced toward the surface of the substrate. That is, a cross section in a short-side direction of the partition layer 954 is a trapezoidal shape, and the bottom side (the side in a direction similar to a plane direction of the insulating layer 953 and in contact with the insulating layer 953) is shorter than the top side (the side in a direction similar to the plane direction of the insulating layer 953 and not in contact with the insulating layer 953). By the provision of the partition layer 954 in this manner, defects of the light-emitting element due to static electricity or the like can be prevented.

In the light-emitting device of this embodiment, the transparent conductive film that is formed using conductive oxynitride including zinc and aluminum is used for a pixel electrode. Thus, the transparent conductive film can be formed without using indium, which can lead to cost reduction of the transparent conductive film and the light-emitting device. In addition, since the transparent conductive film has reduced resistivity, the light-emitting device with low power consumption and high reliability can be manufactured.

Note that the structure described in this embodiment can be combined with any of the structures described in the other embodiments as appropriate.

Embodiment 4

In this embodiment, an example of electronic paper is described as a display device including a pixel electrode which is formed with the use of a transparent conductive film that is formed using conductive oxynitride including zinc and aluminum.

Figure 14:
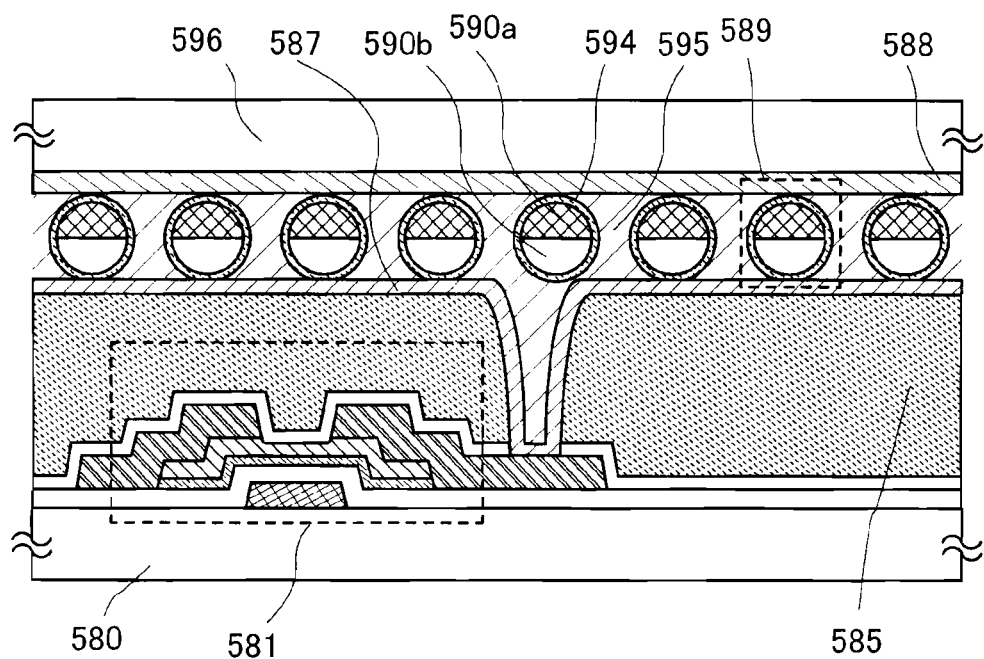
FIG. 14 is a cross-sectional view of a display device according to an embodiment of the present invention.

FIG. 14 illustrates active matrix electronic paper as an example of a display device. The electronic paper in FIG. 14 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

A thin film transistor 581 sealed between a substrate 580 and a substrate 596 is a thin film transistor with a bottom-gate structure, and a source electrode layer and a drain electrode layer thereof is in contact with a first electrode layer 587 at an opening formed in an insulating layer 585, whereby the thin film transistor 581 is electrically connected to the first electrode layer 587. Between the first electrode layer 587 and a second electrode layer 588, spherical particles 589 each having a black region 590a, a white region 590b, and a cavity 594 around the regions, which is filled with liquid, are provided. A space around the spherical particles 589 is filled with a filler 595 such as a resin (see FIG. 14). In this embodiment, the first electrode layer 587 and the second electrode layer 588 correspond to a pixel electrode and a common electrode, respectively. For the first electrode layer 587 serving as a pixel electrode, the transparent conductive film that is formed using conductive oxynitride including zinc and aluminum described in Embodiment 1 can be used. The second electrode layer 588 is electrically connected to a common potential line provided over the same substrate as the thin film transistor 581. The second electrode layer 588 and the common potential line can be electrically connected to each other through conductive particles provided between the pair of substrates.

Further, instead of the twisting ball, an electrophoretic element may be used. A microcapsule having a diameter of approximately 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and black microparticles move to opposite sides from each other, so that white or black can be displayed. A display element using this principle is an electrophoretic display element and is generally called electronic paper. The electrophoretic display element has a higher reflectivity than a liquid crystal display element and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to as a display device simply or a semiconductor device provided with a display device) is distanced from a radio wave source.

An electrophoretic display element is a display element that utilizes a so-called dielectrophoretic effect by which a substance having a high dielectric constant moves to a high-electric field region. An electrophoretic display device using the electrophoretic display element does not need to use a polarizing plate, which is required in a liquid crystal display device.

A solution in which the aforementioned microcapsules are dispersed in a solvent is referred to as electronic ink. This electronic ink can be printed on a surface of glass, plastic, cloth, paper, or the like. Furthermore, with the use of a color filter or particles each containing a pigment, color display can be achieved, as well.

In addition, if a plurality of the aforementioned microcapsules are arranged as appropriate over an active matrix substrate so as to be interposed between two electrodes, an active matrix display device can be completed, and display can be performed upon application of an electric field to the microcapsules.

Note that the particles in the microcapsules may each be formed using a single material selected from a conductive material, an insulating material, a semiconductor material, a magnetic material, a liquid crystal material, a ferroelectric material, an electroluminescent material, an electrochromic material, or a magnetophoretic material or a composite material of any of these.

In the electronic paper of this embodiment, the transparent conductive film that is formed using conductive oxynitride including zinc and aluminum is used for a pixel electrode. Thus, the transparent conductive film can be formed without using indium, which can lead to cost reduction of the transparent conductive film and the electronic paper. In addition, since the transparent conductive film has reduced resistivity, the electronic paper with low power consumption and high reliability can be manufactured.

The above-described electronic paper can be used for electronic devices of a variety of fields as long as they can display data. For example, electronic paper can be applied to an electronic book reader (e-book), a poster, an advertisement in a vehicle such as a train, displays of various cards such as a credit card, and the like. Examples of the electronic devices are illustrated in FIGS. 15A and 15B and FIG. 16.

Figure 15A:
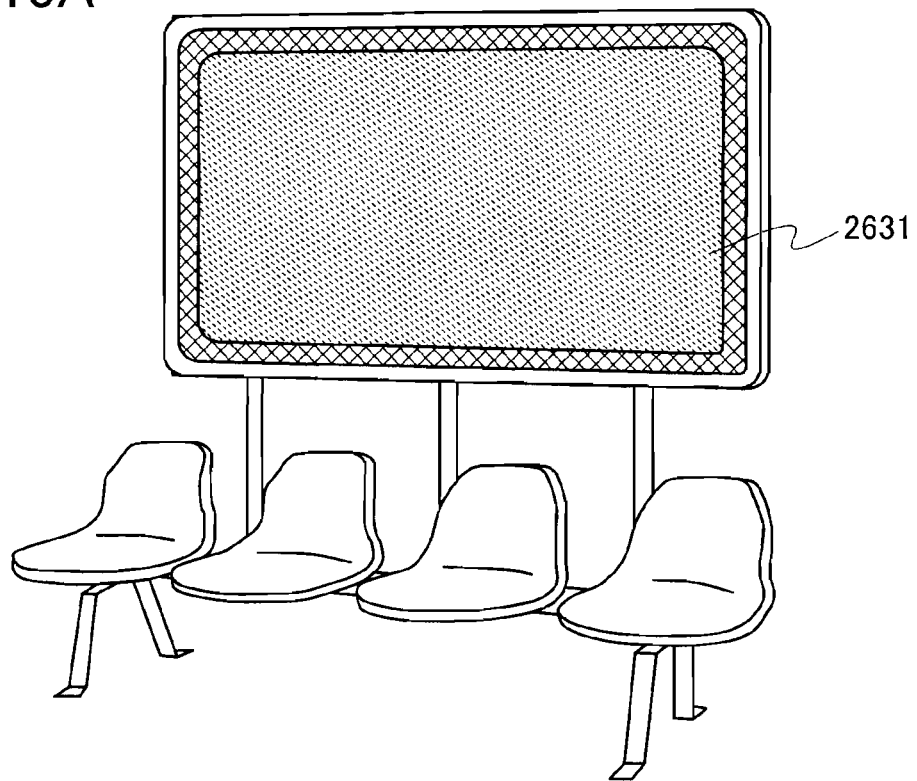
FIGS. 15A and 15B each illustrate an example of a usage pattern of electronic paper.

FIG. 15A illustrates a poster 2631 formed using electronic paper. In the case where an advertising medium is printed paper, the advertisement is replaced by manpower; however, by using electronic paper, the advertising display can be changed in a short time. Further, an image can be stably displayed without display deterioration. Note that the poster may have a configuration capable of wirelessly transmitting and receiving data.

Figure 15B:
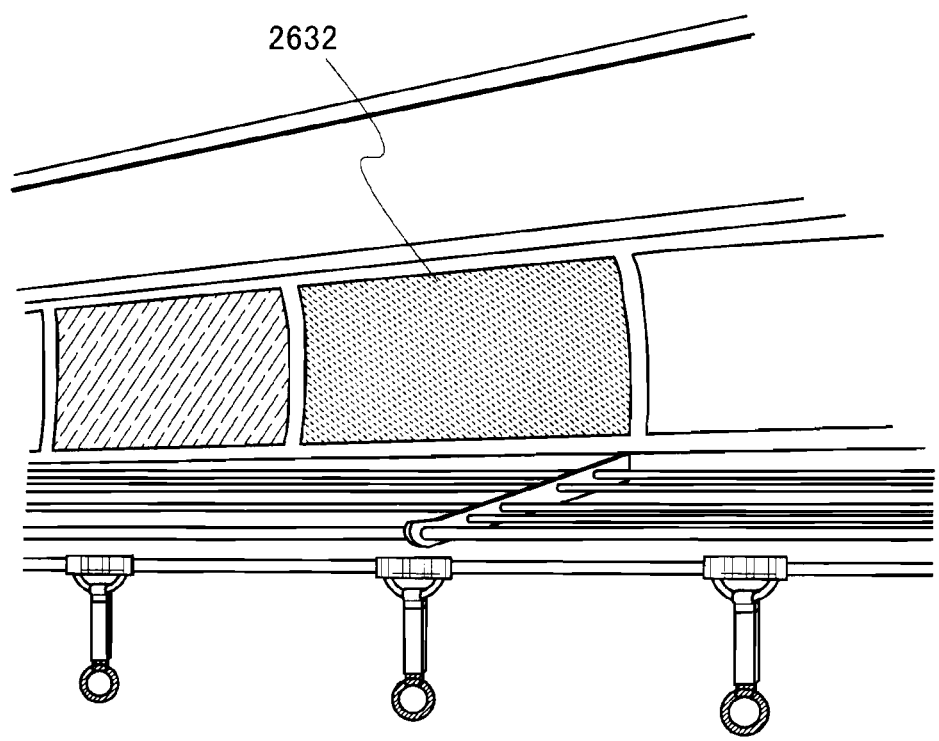

FIG. 15B illustrates an advertisement 2632 in a vehicle such as a train. In the case where an advertising medium is printed paper, the advertisement is replaced by manpower; however, by using electronic paper, the advertising display can be changed in a short time without a lot of manpower. Further an image can be stably displayed without display deterioration. Note that the advertisement in a vehicle may have a configuration capable of wirelessly transmitting and receiving data.

FIG. 16 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can be operated like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 16) can display text and a display portion on the left side (the display portion 2707 in FIG. 16) can display graphics.

FIG. 16 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Further, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Further, the electronic book reader 2700 may have a function of an electronic dictionary.

The electronic book reader 2700 may have a configuration capable of wirelessly transmitting and receiving data. A structure may be employed in which a desired book data or the like is purchased and downloaded from an electronic book server wirelessly.

Note that the structure described in this embodiment can be combined with any of the structures described in the other embodiments as appropriate.

Embodiment 5

The transparent conductive film and the display device using the transparent conductive film disclosed in this specification can be applied to a variety of electronic devices (including an amusement machine). Examples of electronic devices are a lighting device, a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 17A:
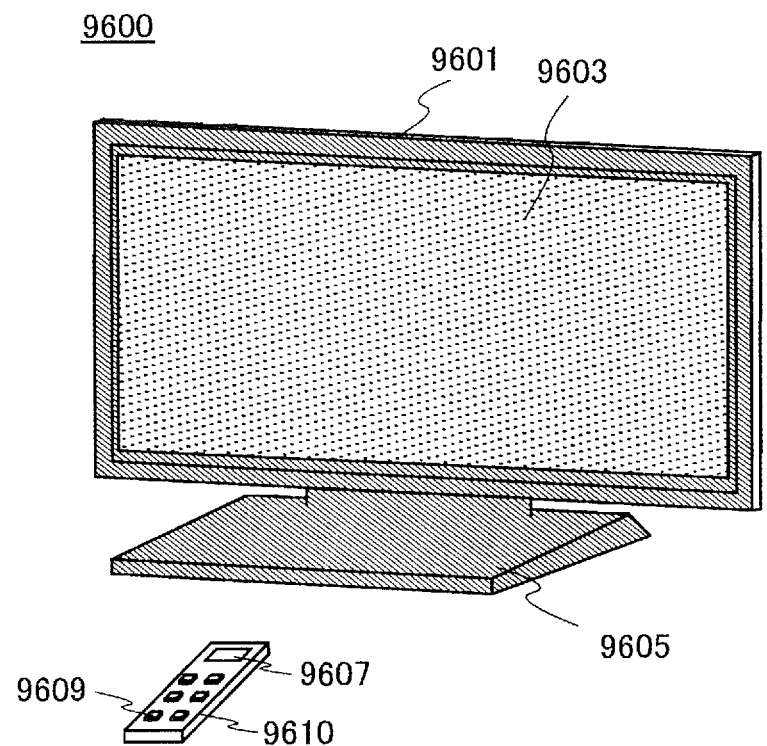
FIG. 17A is an external view of an example of a television device and FIG. 17B is an external view of an example of a digital photo frame.

FIG. 17A illustrates an example of a television set 9600. In the television set 9600, a display portion 9603 is incorporated in a housing 9601. The display portion 9603 can display an image. Further, the housing 9601 is supported by a stand 9605 here.

The television set 9600 can be operated by an operation switch of the housing 9601 or a separate remote controller 9610. Channels and volume can be controlled by operation keys 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the receiver, a general television broadcast can be received. Further, when the television set 9600 is connected to a communication network by wired or wireless connection via the modem, one-way (from a transmitter to a receiver) or two-way (between a transmitter and a receiver or between receivers) data communication can be performed.

In the display portion 9603, the transparent conductive film that is formed using conductive oxynitride including zinc and aluminum is used for a pixel electrode. Thus, indium is not used in the transparent conductive film, which can lead to cost reduction of the television set 9600. In addition, since the transparent conductive film that is formed using conductive oxynitride including zinc and aluminum has reduced resistivity, the television set 9600 can have low power consumption and high reliability.

Figure 17B:
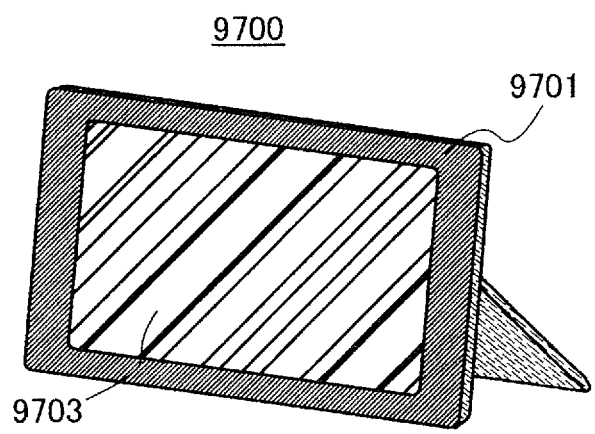

FIG. 17B illustrates an example of a digital photo frame 9700. For example, in the digital photo frame 9700, a display portion 9703 is incorporated in a housing 9701. The display portion 9703 can display various images. For example, the display portion 9703 can display data of an image shot by a digital camera or the like to function as a normal photo frame.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the surface on which the display portion is provided, it is preferable to provide them on the side surface or the back surface for the design of the digital photo frame 9700. For example, a memory which stores data of an image shot by a digital camera is inserted in the recording medium insertion portion of the digital photo frame, whereby the image data can be transferred and displayed on the display portion 9703.

The digital photo frame 9700 may be configured to transmit and receive data wirelessly. A structure may be employed in which desired image data is transferred wirelessly to be displayed.

In the display portion 9703, the transparent conductive film that is formed using conductive oxynitride including zinc and aluminum is used for a pixel electrode. Thus, indium is not used in the transparent conductive film, which can lead to cost reduction of the digital photo frame 9700. In addition, since the transparent conductive film that is formed using conductive oxynitride including zinc and aluminum has reduced resistivity, the digital photo frame 9700 can have low power consumption and high reliability.

Figure 18A:
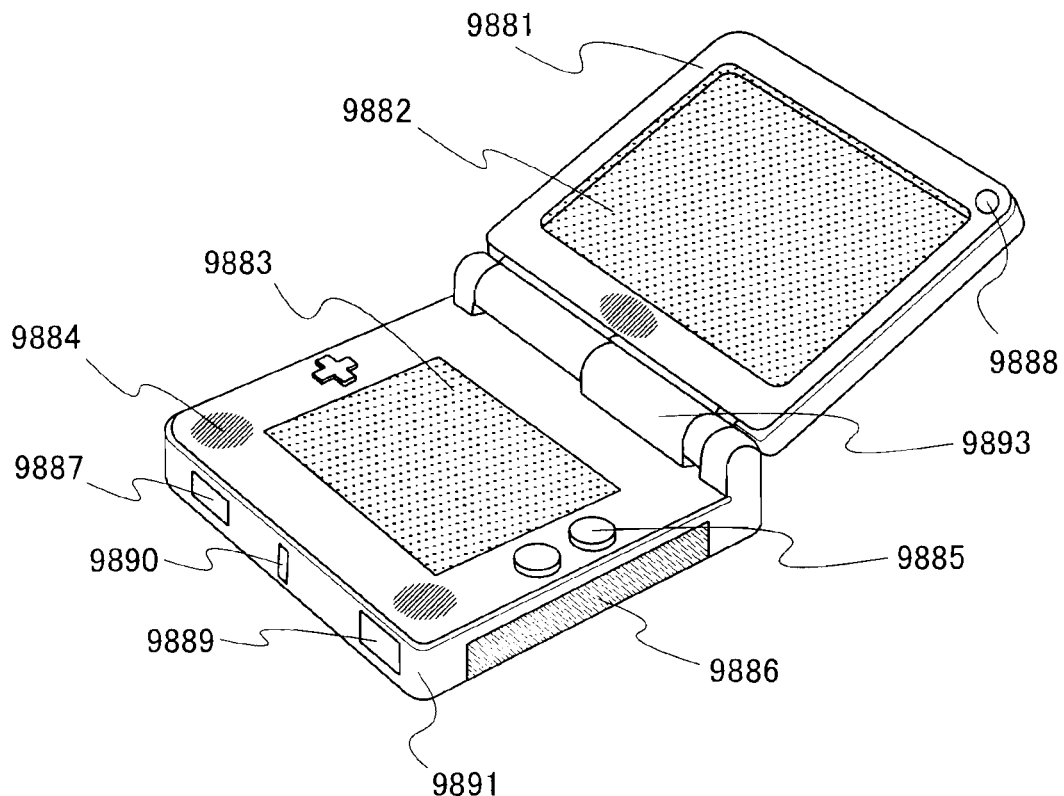
FIGS. 18A and 18B are each an external view of an example of an amusement machine.

FIG. 18A illustrates a portable game machine including a housing 9881 and a housing 9891 which are jointed with a connector 9893 so as to be able to open and close. A display portion 9882 and a display portion 9883 are incorporated in the housing 9881 and the housing 9891, respectively. In addition, the portable game machine illustrated in FIG. 18A includes a speaker portion 9884, a storage medium inserting portion 9886, an LED lamp 9890, an input means (operation keys 9885, a connection terminal 9887, a sensor 9888 (including a function of measuring force, displacement, position, speed, acceleration, angular speed, the number of rotations, distance, light, liquid, magnetism, temperature, chemical substance, sound, time, hardness, electric field, current, voltage, electric power, radiation, flow rate, humidity, tilt angle, vibration, smell, or infrared ray), a microphone 9889), and the like. Needless to say, the structure of the portable game machine is not limited to the above, and may be any structure as long as at least a display device including the transparent conductive film disclosed in this specification is provided. Moreover, another accessory may be provided as appropriate. The portable game machine illustrated in FIG. 18A has a function of reading out a program or data stored in a storage medium to display it on the display portion, and a function of sharing information with another portable game machine by wireless communication. The portable game machine in FIG. 18A can have a variety of functions other than those described above.

In the display portion 9883, the transparent conductive film that is formed using conductive oxynitride including zinc and aluminum is used for a pixel electrode. Thus, indium is not used in the transparent conductive film, which can lead to cost reduction of the portable game machine. In addition, since the transparent conductive film that is formed using conductive oxynitride including zinc and aluminum has reduced resistivity, the portable game machine can have low power consumption and high reliability.

Figure 18B:
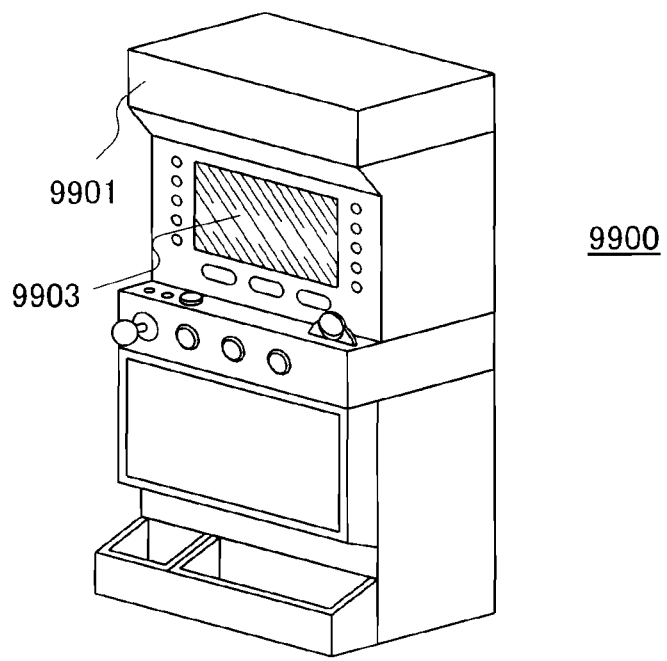

FIG. 18B illustrates an example of a slot machine 9900, which is a large game machine. A display portion 9903 is incorporated in a housing 9901 of the slot machine 9900. In addition, the slot machine 9900 includes an operation means such as a start lever or a stop switch, a coin slot, a speaker, and the like. Needless to say, the structure of the slot machine 9900 is not limited to the above, and may be any structure as long as at least a display device including the transparent conductive film disclosed in this specification is provided. Moreover, another accessory may be provided as appropriate.

In the display portion 9903, the transparent conductive film that is formed using conductive oxynitride including zinc and aluminum is used for a pixel electrode. Thus, indium is not used in the transparent conductive film, which can lead to cost reduction of the large game machine. In addition, since the transparent conductive film that is formed using conductive oxynitride including zinc and aluminum has reduced resistivity, the large game machine can have low power consumption and high reliability.

Figure 19A:
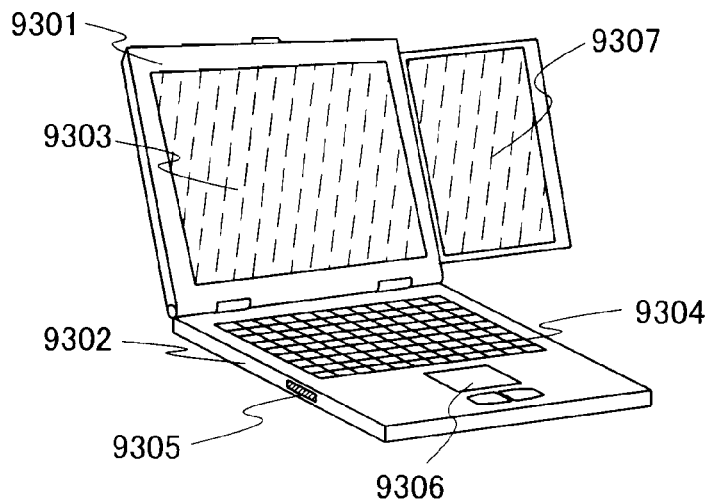
FIG. 19A is an external view of an example of a portable computer and FIG. 19B is an external view of an example of a mobile phone.

FIG. 19A is a perspective view illustrating an example of a portable computer.

In the portable computer of FIG. 19A, a top housing 9301 having a display portion 9303 and a bottom housing 9302 having a keyboard 9304 can overlap with each other by closing a hinge unit which connects the top housing 9301 and the bottom housing 9302. The portable computer in FIG. 19A is convenient for carrying around. Moreover, in the case of using the keyboard for input, the hinge unit is opened so that a user can input looking at the display portion 9303.

The bottom housing 9302 includes a pointing device 9306 with which input is performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301 further includes a display portion 9307 which can be stored in the top housing 9301 by being slid therein. Thus, a large display screen can be realized. In addition, the user can adjust the orientation of a screen of the storable display portion 9307. When the storable display portion 9307 is a touch panel, input can be performed by touching part of the storable display portion. The transparent conductive film that is formed using conductive oxynitride including zinc and aluminum described in Embodiment 1 can be used as an input detection electrode of the touch panel. The transparent conductive film can be formed without using indium, which can lead to cost reduction of the input detection electrode.

The display portion 9303 or the storable display portion 9307 is formed using an image display device such as a liquid crystal display panel or a light-emitting display panel using an organic light-emitting element, an inorganic light-emitting element, or the like.

In addition, the portable computer in FIG. 19A can be provided with a receiver and the like and can receive a television broadcast to display an image on the display portion. While the hinge unit which connects the top housing 9301 and the bottom housing 9302 is kept closed, the whole screen of the display portion 9307 is exposed by sliding the display portion 9307 out and the angle of the screen is adjusted; thus, the user can watch a television broadcast. In this case, the hinge unit is not opened and display is not performed on the display portion 9303. In addition, start up of only a circuit for displaying the television broadcast is performed. Therefore, power consumption can be minimized, which is advantageous for the portable computer whose battery capacity is limited.

In the display portion 9303 or the storable display portion 9307, the transparent conductive film that is formed using conductive oxynitride including zinc and aluminum is used for a pixel electrode. Thus, indium is not used in the transparent conductive film, which can lead to cost reduction of the portable computer. In addition, since the transparent conductive film that is formed using conductive oxynitride including zinc and aluminum has reduced resistivity, the portable computer can have low power consumption and high reliability.

Figure 19B:
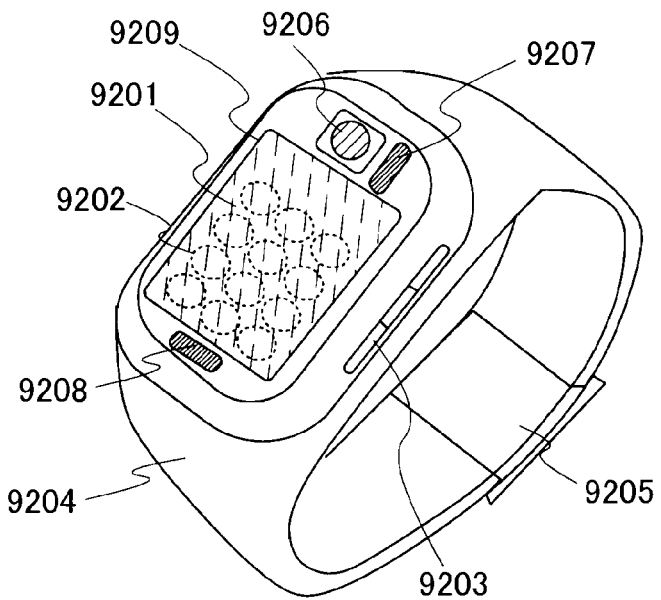

FIG. 19B is a perspective view illustrating an example of a mobile phone that a user can wear on the wrist like a wristwatch.

This mobile phone is formed including a main body which includes a communication device having at least a telephone function, and a battery; a band portion which enables the main body to be worn on the wrist; an adjusting portion 9205 for adjusting the band portion to fit the wrist; a display portion 9201; a speaker 9207; and a microphone 9208.

In addition, the main body includes operation switches 9203. The operation switches 9203 can serve, for example, as a switch for starting a program for the Internet when the switch is pushed, in addition to serving as a switch for turning on a power source, a switch for shifting the display, a switch for instruction to start taking images, or the like, and can be configured to have respective functions.

Input to this mobile phone is operated by touching the display portion 9201 with a finger, an input pen, or the like, by operating the operation switches 9203, or by inputting voice into the microphone 9208. In FIG. 19B, the display portion 9201 includes a touch panel 9209, and display buttons 9202 are displayed on the display portion 9201. Input can be performed by touching the display buttons 9202 with a finger or the like. The transparent conductive film that is formed using conductive oxynitride including zinc and aluminum described in Embodiment 1 can be used as an input detection electrode of the touch panel 9209. The transparent conductive film can be formed without using indium, which can lead to cost reduction of the input detection electrode.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 19B may be provided with a receiver of a television broadcast and the like, and thus can display an image on the display portion 9201 by receiving a television broadcast. In addition, the mobile phone illustrated in FIG. 19B may be provided with a storage device and the like such as a memory, and thus can record a television broadcast in the memory. The mobile phone illustrated in FIG. 19B may have a function of collecting location information, such as the GPS.

An image display device such as a liquid crystal display panel or a light-emitting display panel using an organic light-emitting element, an inorganic light-emitting element, or the like is used as the display portion 9201. The mobile phone illustrated in FIG. 19B is compact and lightweight and thus has limited battery capacity. Therefore, a panel which can be driven with low power consumption is preferably used as a display device for the display portion 9201.

In the display portion 9201, the transparent conductive film that is formed using conductive oxynitride including zinc and aluminum is used for a pixel electrode. Thus, indium is not used in the transparent conductive film, which can lead to cost reduction of the mobile phone. In addition, since the transparent conductive film that is formed using conductive oxynitride including zinc and aluminum has reduced resistivity, the mobile phone can have low power consumption and high reliability.

Note that FIG. 19B illustrates the electronic device which is worn on the wrist; however, this embodiment is not limited thereto as long as a portable shape is employed.

Figure 20:
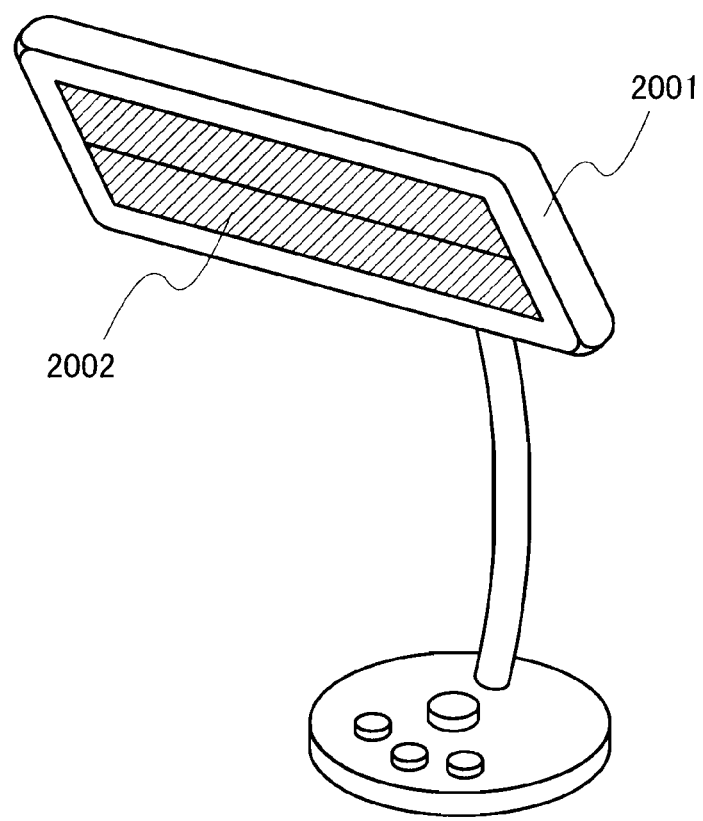
FIG. 20 is an external view of an example of a lighting device.

FIG. 20 illustrates an example in which the light-emitting device described in Embodiment 3 is used in a table lamp which is a lighting device. The table lamp illustrated in FIG. 20 includes a housing 2001 and a light source 2002 to which the light-emitting device described in Embodiment 3 is applied. In the light-emitting device described in Embodiment 3, the transparent conductive film that is formed using conductive oxynitride including zinc and aluminum is used for a pixel electrode. Thus, the transparent conductive film can be formed without using indium, which can lead to cost reduction of the table lamp. In addition, since the transparent conductive film has reduced resistivity, the table lamp with low power consumption and high reliability can be manufactured.

The transparent conductive film that is formed using conductive oxynitride including zinc and aluminum described in Embodiment 1 can also be used for other applications without limitation to the display devices and electronic devices described above. For example, the transparent conductive film can be applied to an electrode such as a surface electrode for a solar cell; a functional film such as an anti-reflection film, an antistatic film, a transparent heat reflective film, an infrared ray shielding film, an electromagnetic wave shielding film, or an electromagnetic wave receiving film; functional glass on which such a functional film is deposited; or the like, which can be used in a variety of electronic devices including the above-described electronic devices.

The use of the transparent conductive film that is formed using conductive oxynitride including zinc and aluminum in this embodiment enables formation of the transparent conductive film without using indium. Thus, the cost of the transparent conductive film and the electronic device can be reduced.

Note that the structure described in this embodiment can be combined with any of the structures described in the other embodiments as appropriate.

Example 1

In this example, transparent conductive films are formed using conductive oxynitride including zinc and aluminum in accordance with Embodiment 1, and change in carrier density, mobility, resistivity, and transmissivity with respect to visible light (light having a wavelength of 470 nm, light having a wavelength of 530 nm, and light having a wavelength of 680 nm) depending on the amount of aluminum nitride and the heat treatment after the film formation will be described.

Non-alkali glass substrates each having a thickness of 0.7 mm (EAGLE 2000 manufactured by Corning. Inc.) were used in this example. Next, oxynitride including zinc and aluminum was deposited over the substrates by a sputtering method using a target (ZnO:AlN=100:1 (mol)) made by sintering zinc oxide and aluminum nitride and having a diameter of 6 inches. Over the target, aluminum nitride chips (AlN chips) (10 mm×10 mm×1 mm) were set. Here, zero, two, four, eight, and sixteen AlN chips were set symmetrically with respect to a point, over the respective targets. In this manner, transparent conductive films with various amounts of aluminum nitride included therein were formed. The conditions of the sputtering method were as follows: the temperature was room temperature, the pressure was 0.4 Pa, the argon gas flow rate was 40 sccm, the distance between the substrate and the target was 185 mm, and the radio frequency (RF) power supply was 0.5 kW. The intended thickness of the transparent conductive film was 100 nm. In this manner, the transparent conductive films that were formed using conductive oxynitride including zinc and aluminum were formed over the substrates.

Aside from the above-described transparent conductive films, the transparent conductive films which were formed in the same way as the above and then subjected to heat treatment at 350° C. in a furnace under a nitrogen atmosphere for 1 hour were prepared.

Thus, the transparent conductive films formed using, as targets, ZnO—AlN compounds over which zero, two, four, eight, and sixteen chips of aluminum nitride were set and the transparent conductive films which were formed in the same way as the above and then subjected to heat treatment under a nitrogen atmosphere for 1 hour were prepared.

In addition, a transparent conductive film was formed using ITO as a comparative example. The film formation conditions of the transparent conductive film formed using ITO were as follows: the temperature was room temperature, the pressure was 0.4 Pa, the distance between the substrate and the target was 60 mm, and the direct current (DC) power supply was 0.5 kW. The film formation gas was a mixture of an argon gas, an oxygen gas, and a hydrogen gas, and the flow rate was Ar/O$_2$/H$_2$=50/1/1 (sccm).

Next, Hall effect measurement was performed on the transparent conductive films formed over the substrates, and the carrier density, the mobility, and the resistivity were calculated. Further, the transmissivities of the transparent conductive films with respect to blue light having a wavelength of 470 nm, green light having a wavelength of 530 nm, and red light having a wavelength of 680 nm were measured.

The Hall effect measurement is a method for measuring electric properties such as carrier density, mobility, and resistivity with the use of the Hall effect, which is the production of an electromotive force in a direction perpendicular to both current and magnetic field when the magnetic field is perpendicularly applied to an object in which the current flows. In this example, the Van der Pauw method was employed in which four corners of the rectangular transparent conductive films were provided with an ohmic electrode and the electric potential difference between the electrodes and the value of resistance were measured. Note that ResiTest8300 series manufactured by TOYO Corporation was used for the Hall effect measurement.

Figure 1B:
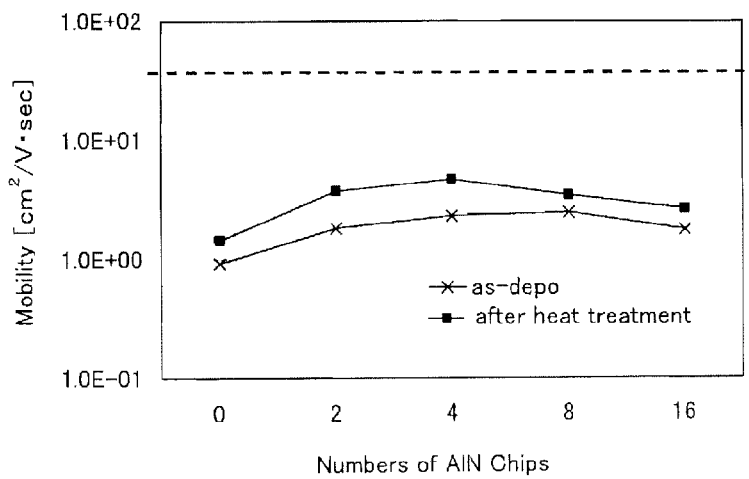
Figure 1C:
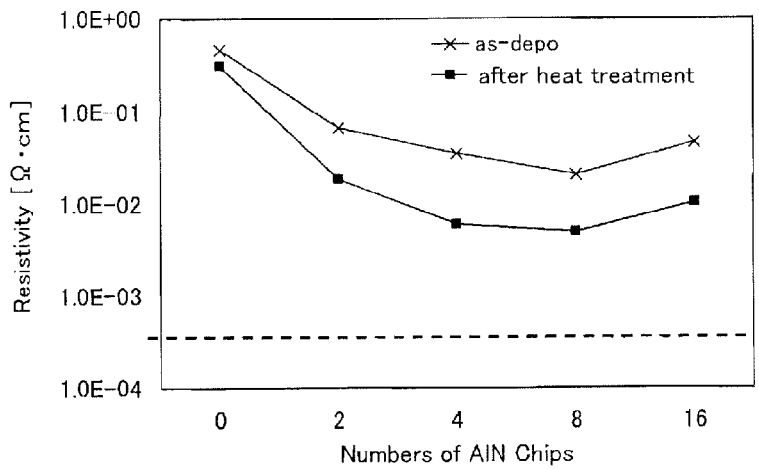
Figure 2A:
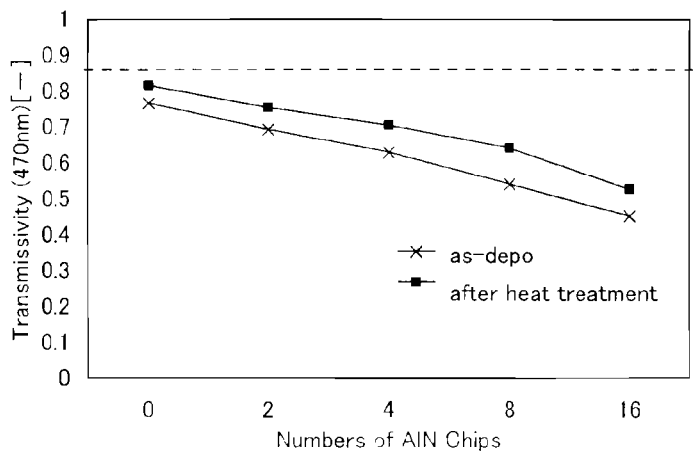
FIGS. 2A to 2C show transmissivity measurement results of transparent conductive films.
Figure 2B:
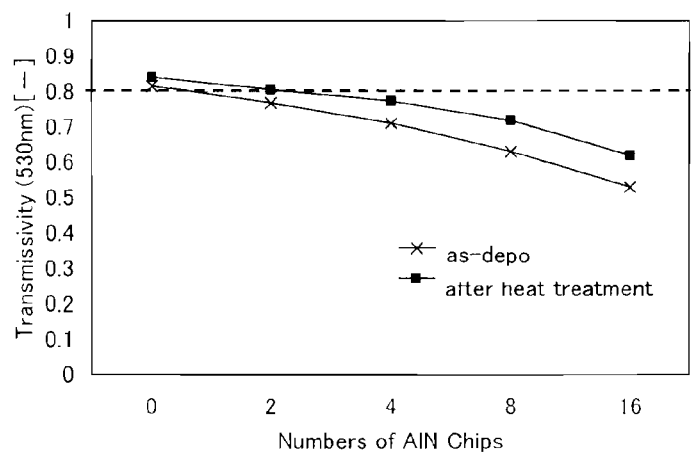
Figure 2C:
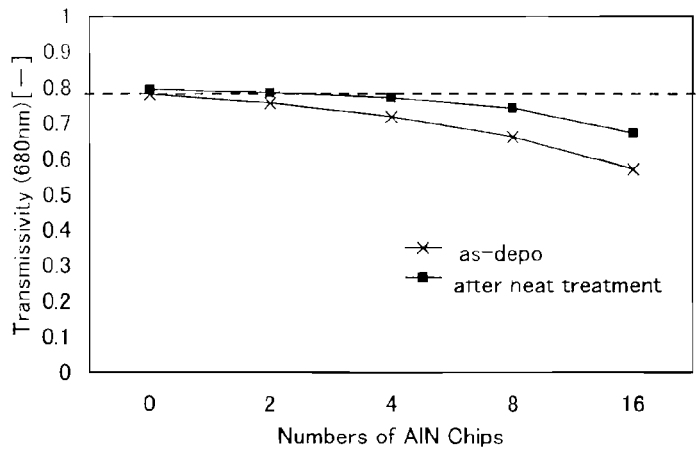

The Hall effect measurement results and the transmissivity measurement results of the respective transparent conductive films are shown in FIGS. 1A to 1C, FIGS. 2A to 2C, and Table 1. The vertical axis indicates the carrier density [cm$^{-3}$] in FIG. 1A, the mobility [cm$^2$/V·sec] in FIG. 1B, and the resistivity [Ω·cm] in FIG. 1C. The horizontal axis indicates the number of AlN chips in FIGS. 1A to 1C. FIG. 2A shows the transmissivity with respect to blue light having a wavelength of 470 nm, FIG. 2B shows the transmissivity with respect to green light having a wavelength of 530 nm, and FIG. 2C shows the transmissivity with respect to red light having a wavelength of 680 nm. In FIGS. 2A to 2C, the vertical axis indicates the transmissivity and the horizontal axis indicates the number of AlN chips. Table 1 shows the values of the carrier density, the mobility, the resistivity, and the transmissivities with respect to visible lights having respective wavelengths of the transparent conductive films. The thick broken lines in FIGS. 1A to 1C and FIGS. 2A to 2C show the carrier density, the mobility, the resistivity, and the transmissivities with respect to visible lights having respective wavelengths of the transparent conductive film formed using ITO.

ductive film is reduced when the number of AlN chips is increased from four to eight, and further from eight to sixteen.

Here, it is preferable that the mobility of the transparent conductive film be 4.0 cm$^2$/V·sec or higher, and the number of AlN chips at the time of forming the transparent conductive film is preferably two or more. Further, it is more preferable that the mobility of the transparent conductive film be 4.7 cm$^2$/V·sec or higher, and the number of AlN chips at the time of forming the transparent conductive film be four or more.

TABLE 1

| | numbers of AlN chips | | | | | | | | | |
|---|---|---|---|---|---|---|---|---|---|---|
| | 0 | | 2 | | 4 | | 8 | | 16 | |
| heat treatment | as-depo | after heat treatment | as-depo | after heat treatment | as-depo | after heat treatment | as-depo | after heat treatment | as-depo | after heat treatment |
| carrier density [cm$^{-3}$] | 1.5E+19 | 1.4E+19 | 5.0E+19 | 8.8E+19 | 7.6E+19 | 2.2E+20 | 1.2E+20 | 3.6E+20 | 7.4E+19 | 2.3E+20 |
| mobility [cm$^2$/V·sec] | 9.2E−01 | 1.5E+00 | 1.8E+00 | 3.8E+00 | 2.3E+00 | 4.7E+00 | 2.5E+00 | 3.5E+00 | 1.8E+00 | 2.6E+00 |
| resistivity [Ω·cm] | 4.7E−01 | 3.1E−01 | 6.8E−02 | 1.9E−02 | 3.5E−02 | 6.1E−03 | 2.1E−02 | 5.0E−03 | 4.7E−02 | 1.0E−02 |
| transmissivity (470 nm)[−] | 0.77 | 0.82 | 0.69 | 0.75 | 0.63 | 0.71 | 0.54 | 0.64 | 0.45 | 0.53 |
| transmissivity (530 nm)[−] | 0.82 | 0.84 | 0.77 | 0.81 | 0.71 | 0.77 | 0.63 | 0.72 | 0.53 | 0.62 |
| transmissivity (680 nm)[−] | 0.78 | 0.80 | 0.76 | 0.79 | 0.72 | 0.77 | 0.66 | 0.74 | 0.57 | 0.67 |

It can be understood from FIG. 1A that from zero to eight in the number of AlN chips, the carrier density increases in accordance with the increase in the number of AlN chips, that is, the increase in the amount of aluminum nitride in the transparent conductive film, regardless of whether heat treatment is performed. In addition, except for the case where the number of AlN chips is zero, heat treatment after the film formation increases the carrier density of the transparent conductive film. However, when the number of AlN chips is increased to sixteen, the carrier density of the transparent conductive film is reduced from that in the case where the number of AlN chips is eight, regardless of whether the heat treatment is performed.

Here, it is preferable that the carrier density of the transparent conductive film be $1.0 \times 10^{20}$ cm$^{-3}$ or higher, and the number of AlN chips at the time of forming the transparent conductive film be two or more. Further, it is more preferable that the carrier density of the transparent conductive film be $2.2 \times 10^{20}$ cm$^{-3}$ or higher, and the number of AlN chips at the time of forming the transparent conductive film is more preferably four or more. Note that the carrier density of the transparent conductive film formed using ITO was $4.2 \times 10^{20}$ cm$^{-3}$. Accordingly, the carrier density of the transparent conductive film is more preferably higher than or equal to $2.2 \times 10^{20}$ cm$^{-3}$ and lower than $4.2 \times 10^{20}$ cm$^{-3}$.

It can be understood from FIG. 1B that from zero to eight in the number of AlN chips in the case where heat treatment is not performed, the carrier density increases in accordance with the increase in the number of AlN chips, that is, the increase in the amount of aluminum nitride in the transparent conductive film. In addition, heat treatment after the film formation increases the mobility of the transparent conductive film. However, when the number of AlN chips is increased to sixteen, the mobility of the transparent conductive film is reduced from that in the case where the number of AlN chips is eight. Moreover, in the case where the heat treatment is performed, the mobility of the transparent con- Note that the mobility of the transparent conductive film formed using ITO was 36.0 cm$^2$/V·sec. Accordingly, the mobility of the transparent conductive film is more preferably higher than or equal to 4.7 cm$^2$/V·sec and lower than 36.0 cm$^2$/V·sec.

It can be understood from FIG. 1C that from zero to eight in the number of AlN chips, the resistivity decreases in accordance with the increase in the number of AlN chips, that is, the increase in the amount of aluminum nitride in the transparent conductive film, regardless of whether heat treatment is performed. In addition, heat treatment after the film formation decreases the resistivity of the transparent conductive film. However, it can also be observed that the rate of decrease in resistivity becomes smaller as the number of AlN chips is increased. When the number of AlN chips is increased to sixteen, the resistivity of the transparent conductive film is increased from that in the case where the number of AlN chips is eight, regardless of whether the heat treatment is performed.

Here, it is preferable that the resistivity of the transparent conductive film be $1.0 \times 10^{-2}$ Ω·cm or lower, and the number of AlN chips at the time of forming the transparent conductive film be two or more. Further, it is more preferable that the resistivity of the transparent conductive film be $6.1 \times 10^{-3}$ Ω·cm or lower, and the number of AlN chips at the time of forming the transparent conductive film be four or more. Note that the resistivity of the transparent conductive film formed using ITO was $4.1 \times 10^{-4}$ Ω·cm. Accordingly, the resistivity of the transparent conductive film is more preferably higher than $4.1 \times 10^{-4}$ Ω·cm and lower than or equal to $6.1 \times 10^{-3}$ Ω·cm.

It can be understood from FIGS. 2A to 2C that the transmissivities with respect to visible lights having respective wavelengths of 470 nm, 530 nm, and 680 nm decrease in accordance with the increase in the number of AlN chips, that is, the increase in the amount of aluminum nitride in the transparent conductive film, regardless of whether heat treatment is performed. This decrease in transmissivity is more noticeable in the case of light having a shorter wavelength.

Although the transmissivity of the transparent conductive film with respect to light having a wavelength of 470 nm is lower than that of the transparent conductive film formed using ITO, the transmissivities of the transparent conductive film with respect to light having a wavelength of 530 nm and light having a wavelength of 680 nm are almost equivalent to that of the transparent conductive film formed using ITO. In addition, heat treatment after the film formation increases the transmissivities of the transparent conductive film with respect to visible lights having respective wavelengths.

Here, it is preferable that the transmissivities of the transparent conductive film with respect to visible lights having wavelengths of 470 nm, 530 nm, and 680 nm be 0.70 (70%) or higher. Further, it is more preferable that the transmissivities of the transparent conductive film with respect to visible lights having wavelengths of 470 nm, 530 nm, and 680 nm be 0.75 (75%) or higher.

From the above, it is found that basically as the amount of aluminum nitride in the transparent conductive film is increased, the carrier density and the mobility increase and the resistivity decreases. Further, heat treatment after the film formation can increase the carrier density and the mobility and decrease the resistivity. However, when the amount of aluminum nitride included in the transparent conductive film exceeds a certain value, the carrier density and the rate of increase in the mobility due to the heat treatment are reduced; accordingly, the decrease in the resistivity is also suppressed. Further, the transmissivities of the transparent conductive film with respect to lights having respective wavelengths decrease as the amount of aluminum nitride in the transparent conductive film is increased. The decrease in transmissivity is more noticeable in the case of light having a shorter wavelength. Note that the heat treatment after the film formation can increase the transmissivity.

Example 2

In this example, transparent conductive films are formed using conductive oxynitride including zinc and aluminum in accordance with Embodiment 1, and X-ray diffraction (XRD) measurement results of the transparent conductive films will be described.

First, transparent conductive films were formed in a similar manner to that of Example 1, so that transparent conductive films formed using, as targets, ZnO—AlN compounds over which zero, two, and four chips of aluminum nitride were set and transparent conductive films which were formed in the same way as the above and then subjected to heat treatment under a nitrogen atmosphere were prepared.

Figure 3A:
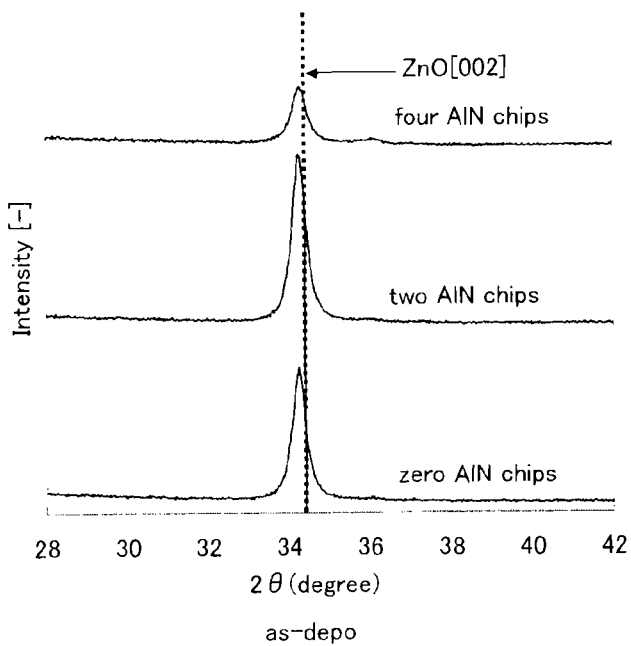
FIGS. 3A and 3B show XRD measurement results of transparent conductive films.
Figure 3B:
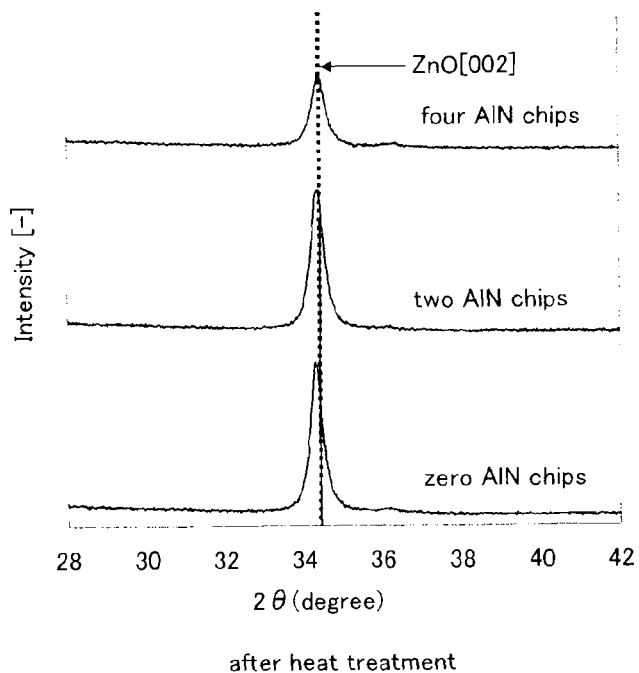

Next, X-ray diffraction measurement was performed on the transparent conductive films formed over the substrates. In the X-ray diffraction measurement results of the respective transparent conductive films in FIGS. 3A and 3B, XRD spectra around the peak attributed to (002) plane of the ZnO hexagonal structure are shown. FIG. 3A shows the XRD measurement results of the transparent conductive films right after the film formation, and FIG. 3B shows the XRD measurement results of the transparent conductive films after the heat treatment under a nitrogen atmosphere. In FIGS. 3A and 3B, the vertical axis indicates the diffraction intensity in an arbitrary unit, and the horizontal axis indicates the diffraction angle 2θ [°]. The lines of XRD measurement results of the transparent conductive films with different numbers of AlN chips are arranged uniformly. Note that the line at 2θ=34.43° corresponds to (002) plane of the ZnO hexagonal structure.

Regardless of the number of AlN chips and whether the heat treatment is performed after the film formation, a peak attributed to (002) plane of the ZnO hexagonal structure is shown in all the XRD spectra of transparent conductive films in FIGS. 3A and 3B. This indicates that the conductive oxynitride including zinc and aluminum, which forms the transparent conductive films, has a polycrystalline structure. Further, since the full widths at half maximum of the peaks of the XRD spectra are not so much different from each other, it can be recognized that the crystallinity is not largely changed depending on the amount of aluminum nitride in the transparent conductive film or whether the heat treatment is performed after the formation of the transparent conductive film.

When the distance between the peak of XRD spectrum and the line at 2θ=34.43° is compared between FIGS. 3A and 3B, the distance between the peak of XRD spectrum and the line at 2θ=34.43° in FIG. 3B is slightly shorter than that in FIG. 3A. This points to the fact that rearrangement in the atomic level is caused in the conductive oxynitride including zinc and aluminum by the heat treatment, thereby reducing distortion in the crystal structure that is generated by the introduction of nitrogen; accordingly, the conductive oxynitride including zinc and aluminum after the heat treatment has a structure closer to the ZnO hexagonal structure. It is supposed that the reduction in distortion in the crystal structure that interrupts carrier transfer leads to improvement in the mobilities of the transparent conductive films. It is also supposed that aluminum located between crystal lattices of the conductive oxynitride is moved into the crystal lattices by the heat treatment and starts to function as a donor; accordingly, the carrier densities in the transparent conductive films are increased.

Example 3

In this example, transparent conductive films are formed using conductive oxynitride including zinc and aluminum in accordance with Embodiment 1, and secondary ion mass spectrometry (SIMS) results of the transparent conductive films will be described.

First, transparent conductive films were formed in a manner similar to that of Example 1, so that transparent conductive films formed using, as targets, ZnO—AlN compounds over which zero, four, and sixteen chips of aluminum nitride were set and transparent conductive films which were formed in the same way as the above and then subjected to heat treatment under a nitrogen atmosphere were prepared.

Figure 4A:
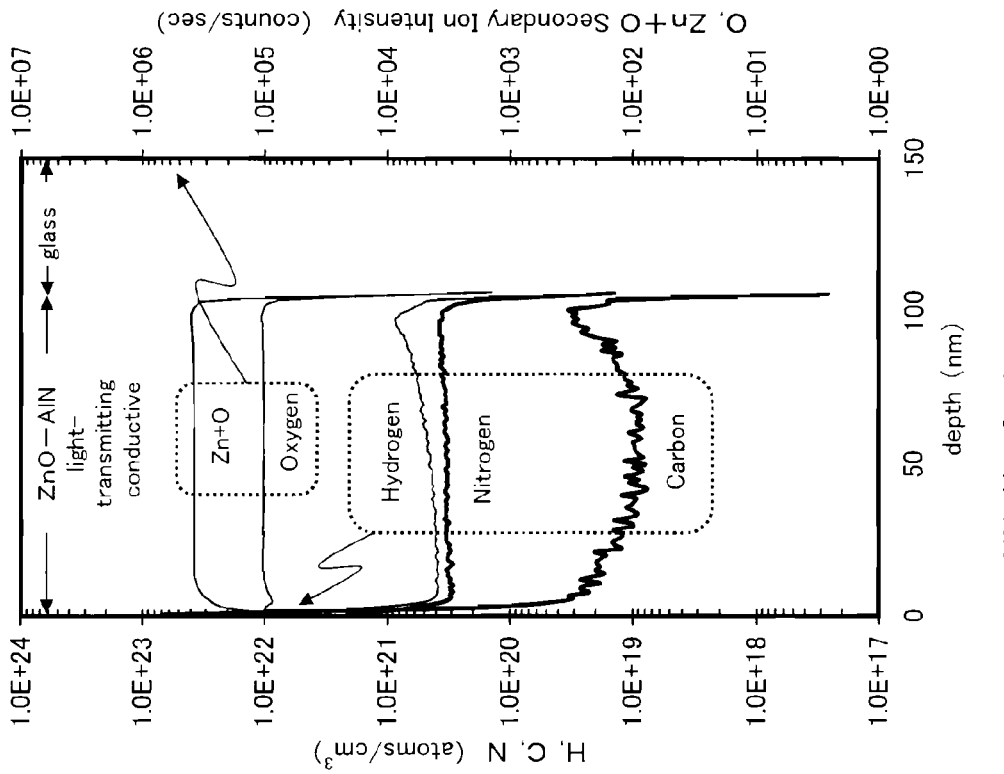
FIGS. 4A and 4B show secondary ion mass spectrometry results of transparent conductive films.
Figure 4B:
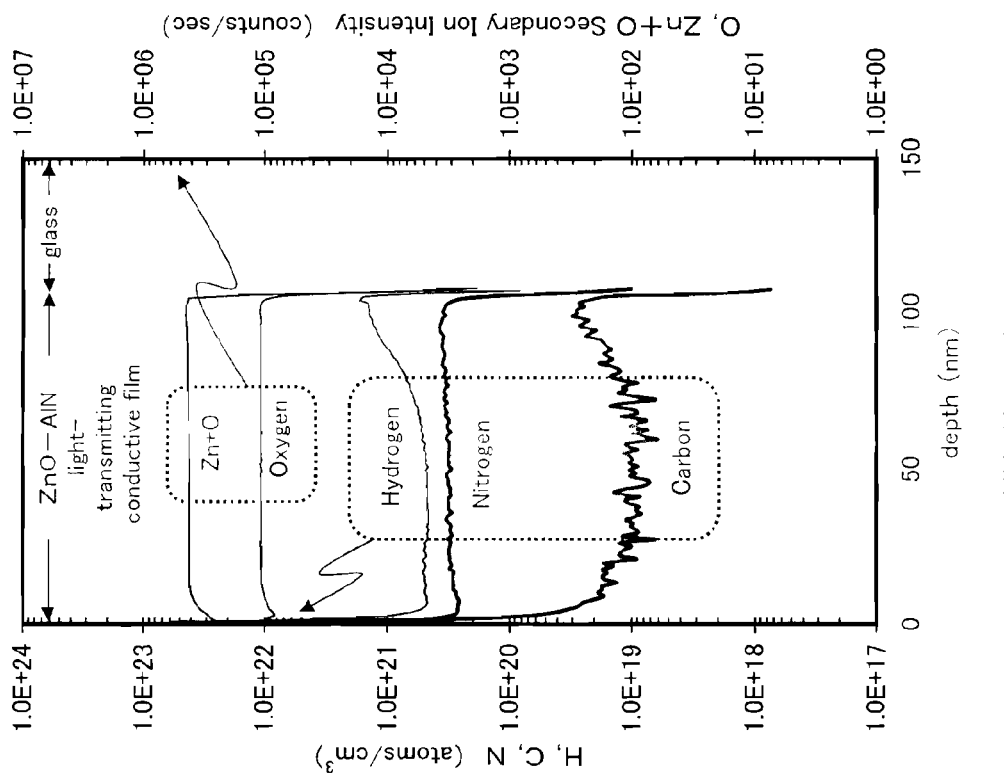
Figure 5A:
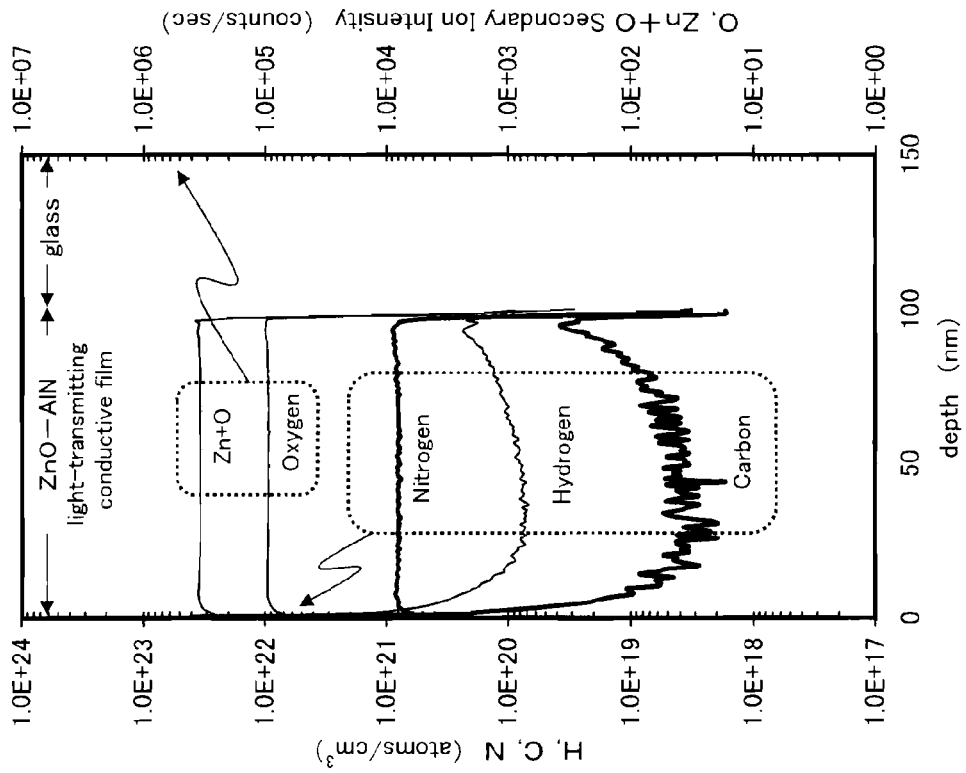
FIGS. 5A and 5B show secondary ion mass spectrometry results of transparent conductive films.
Figure 5B:
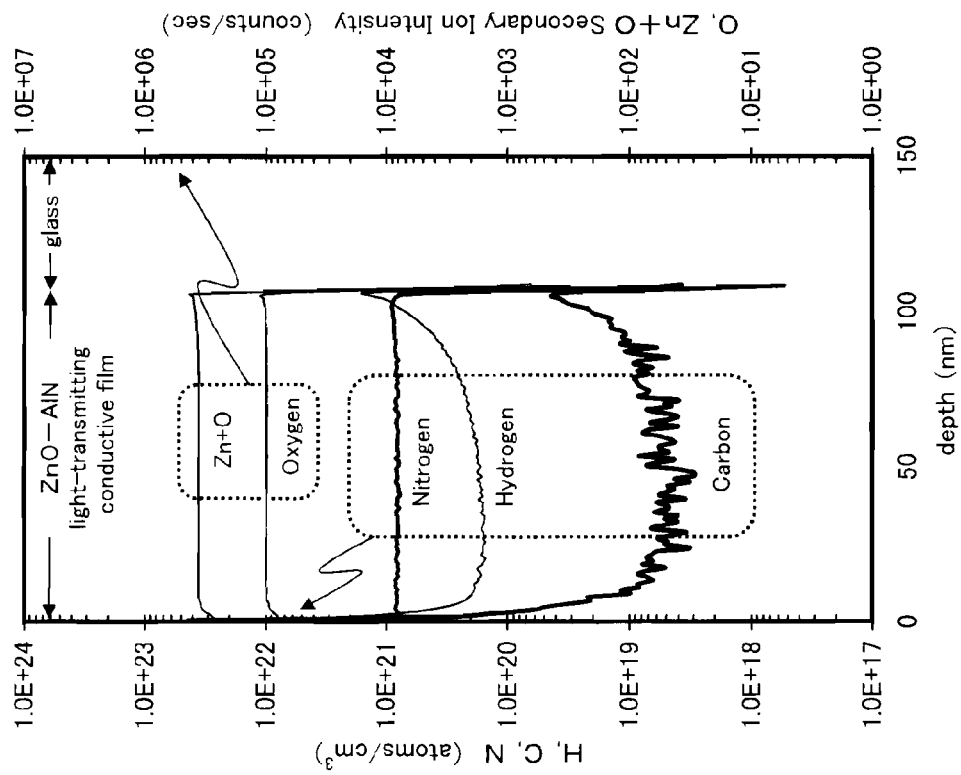
Figure 6A:
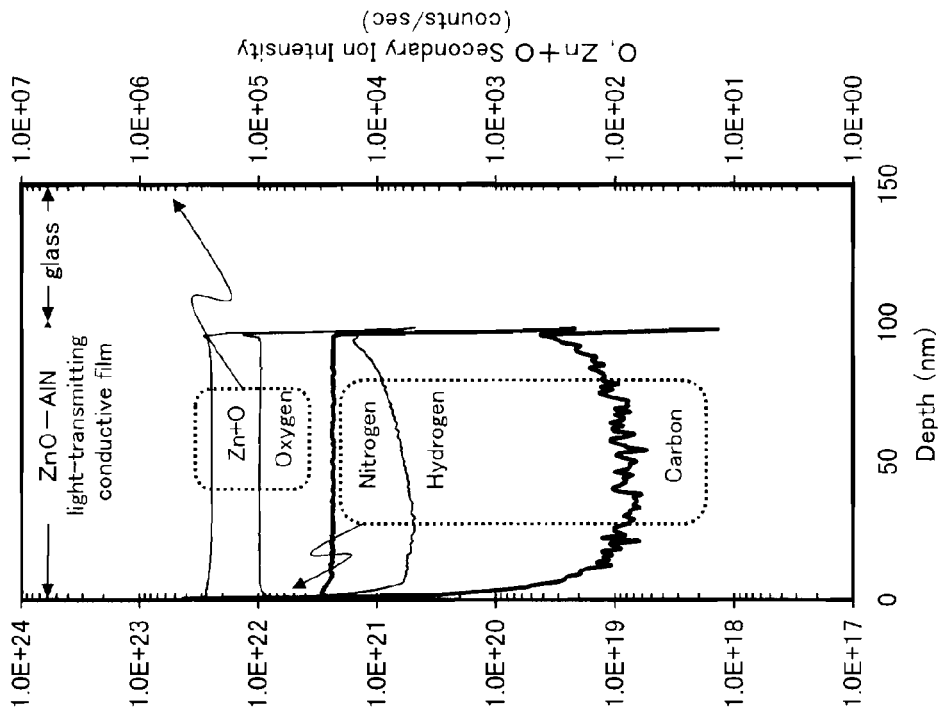
FIGS. 6A and 6B show secondary ion mass spectrometry results of transparent conductive films.
Figure 6B:
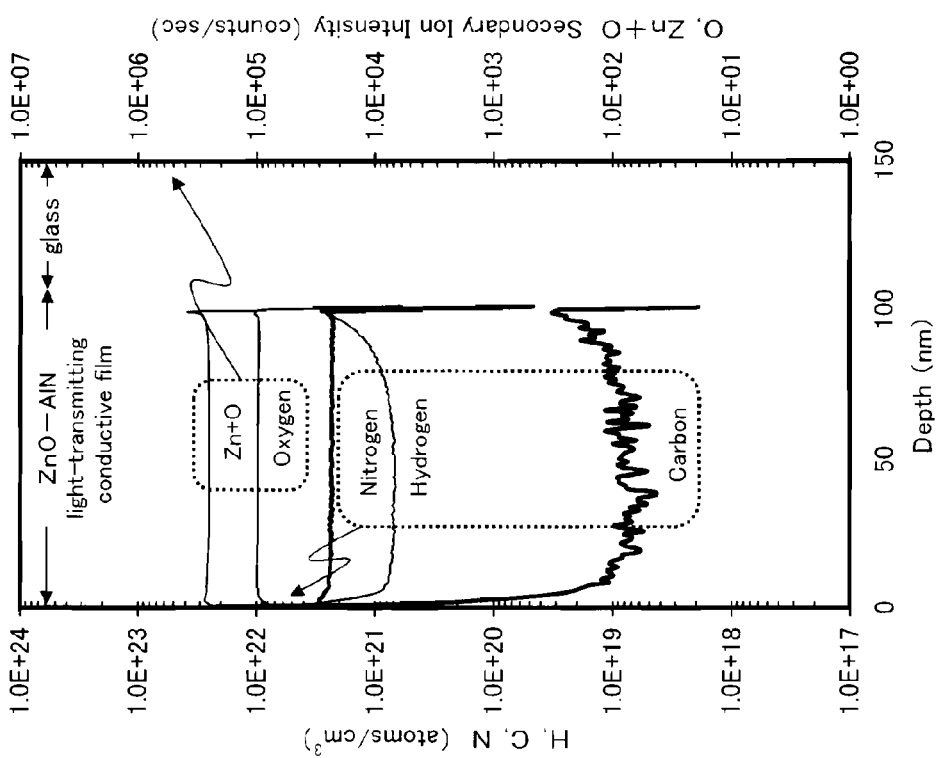

Next, secondary ion mass spectrometry was performed on the transparent conductive films formed over the substrates. FIGS. 4A and 4B, FIGS. 5A and 5B, and FIGS. 6A and 6B show secondary ion mass spectrometry results of the respective transparent conductive films. FIGS. 4A and 4B, FIGS. 5A and 5B, and FIGS. 6A and 6B show secondary ion mass spectrometry results of the transparent conductive films in the case where the number of AlN chips used for the film formation is zero, four, and sixteen, respectively. Further, FIG. 4A, FIG. 5A, and FIG. 6A show the secondary ion mass spectrometry results of the transparent conductive films on which the heat treatment is not performed after film formation, and FIG. 4B, FIG. 5B, and FIG. 6B show those of the transparent conductive films on which the heat treatment is performed after film formation. In each of the figures, the vertical axis on the left side indicates the concentrations [atoms/cm$^3$] of hydrogen (H), carbon (C), and nitrogen (N), and the vertical axis on the right side indicates the secondary ion intensity [counts/sec] of oxygen (O) and oxygen and zinc (Zn+O). Further, the horizontal axis indicates the depths [nm] of the transparent conductive film and the glass substrate from the surface of the transparent conductive film.

When FIG. 4A, FIG. 5A, and FIG. 6A are compared to each other, the concentration of nitrogen in the transparent conductive film formed without using an AlN chip in the film formation is $2.5 \times 10^{20}$ atoms/cm$^3$, the concentration of nitrogen in the transparent conductive film formed using four AlN chips is $8.0 \times 10^{20}$ atoms/cm$^3$, and the concentration of nitrogen in the transparent conductive film formed using sixteen AlN chips is $2.3 \times 10^{21}$ atoms/cm$^3$. Therefore, it seems that nitrogen of the AlN chips is certainly introduced into the transparent conductive films. In addition, nitrogen introduced into the transparent conductive film is almost uniformly distributed in the film thickness direction. Further, there is not a large difference in the secondary ion intensities of oxygen and oxygen and zinc between the cases using different numbers of AlN chips.

Next, FIGS. 4A and 4B, FIGS. 5A and 5B, and FIGS. 6A and 6B are compared to each other regarding whether the heat treatment is performed. A large difference cannot be perceived except for a slight difference in the distribution of hydrogen concentration. Even through the heat treatment under a nitrogen atmosphere, there is not a large change in the concentration of nitrogen.

From the resistivity graph of FIG. 1C, FIGS. 4A and 4B, and FIGS. 5A and 5B, it can be found that a favorable conductivity of the transparent conductive film is obtained when the number of AlN chips is between zero and four, that is, when the concentration of nitrogen in the transparent conductive film is higher than or equal to $5.0 \times 10^{20}$ atoms/cm$^3$. Further, from the resistivity graph of FIG. 1C and FIGS. 6A and 6B, under the above-described conditions, it can be found that a more favorable conductivity of the transparent conductivity can be obtained when the number of AlN chips is sixteen or less, that is, when the concentration of nitrogen in the transparent conductive film is higher than or equal to $5.0 \times 10^{20}$ atoms/cm$^3$ and lower than or equal to $2.3 \times 10^{21}$ atoms/cm$^3$.

Example 4

In this example, transparent conductive films are formed using conductive oxynitride including zinc and aluminum in accordance with Embodiment 1, and results of the analysis using an electron probe X-ray microanalyzer (EPMA) of the transparent conductive films will be described.

First, transparent conductive films were formed in a similar manner to that of Example 1, so that transparent conductive films formed using, as targets, ZnO—AlN compounds over which zero, four, eight, and sixteen chips of aluminum nitride were set and a transparent conductive film which was formed in the same way as the above using, as a target, a ZnO—AlN compound over which four chips of aluminum nitride were set and then subjected to heat treatment under a nitrogen atmosphere were prepared. Differently from Embodiment 1, silicon wafers were used as the substrates over which the transparent conductive films were formed.

Next, EPMA analysis was performed on the transparent conductive films formed over the substrates. The EPMA analysis results of the respective transparent conductive films are shown in Table 2 and FIG. 7. In Table 2 and FIG. 7, percentages (atomic %) of zinc (Zn), aluminum (Al), oxygen (O), and nitrogen (N), which are constituent atoms, in the respective transparent conductive films are shown. Note that the lower limit of the detection in the EPMA analysis is 0.1 atomic % in this embodiment.

TABLE 2

| numbers of AlN chips | heat treatment | Zn [atomic %] | Al [atomic %] | O [atomic %] | N [atomic %] |
|---|---|---|---|---|---|
| 0 | as-depo | 47.2 | 0.5 | 52.3 | lower than or equal to lower limit of detection |
| 4 | as-depo | 46.8 | 1.8 | 50.5 | 0.9 |
|   | after heat treatment | 46.9 | 1.9 | 50.4 | 0.9 |
| 8 | as-depo | 46.3 | 3.0 | 49.0 | 1.6 |
| 16 | as-depo | 41.0 | 7.5 | 48.4 | 3.1 |

Figure 7:
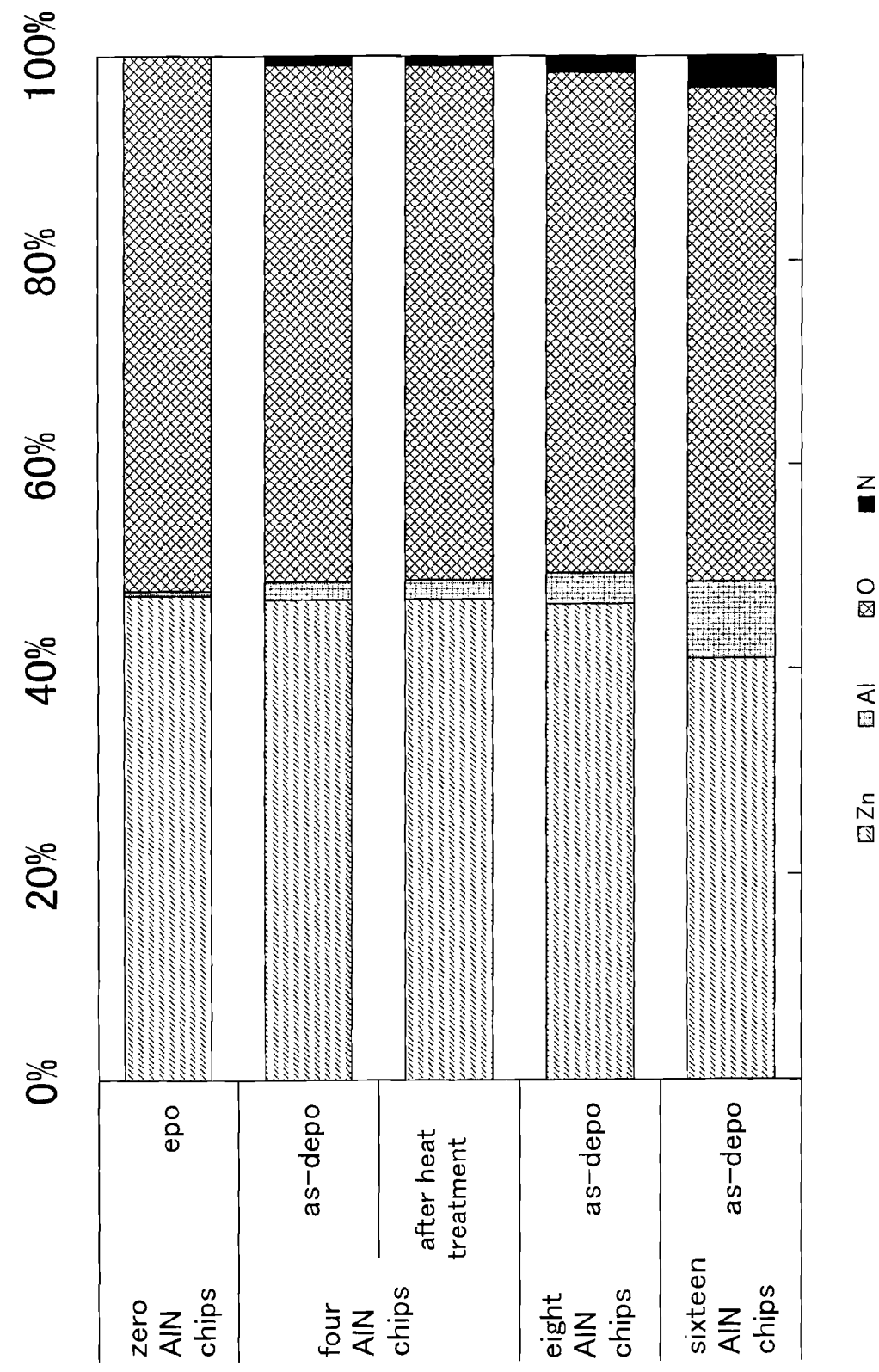
FIG. 7 shows analysis results of transparent conductive films with an electron probe X-ray microanalyzer.

From the comparison of the percentages of components between the transparent conductive films with different numbers of AlN chips in Table 2 and FIG. 7, it can be seen that from zero to eight in the number of AlN chips, the percentages of nitrogen and aluminum increase and the percentages of oxygen and zinc decrease in accordance with the increase in the number of AlN chips. The percentages of aluminum in the cases where the number of AlN chips is zero, four, eight, and sixteen are 0.5 atomic %, 1.8 atomic %, 3.0 atomic %, 7.5 atomic %, respectively. The percentage of nitrogen in the case where the number of AlN chips is zero is lower than or equal to the lower limit of the detection, and the percentages of nitrogen in the cases where the number of AlN chips is four, eight, and sixteen are 0.9 atomic %, 1.6 atomic %, 3.1 atomic %, respectively. Further, the percentages of oxygen in the cases where the number of AlN chips is zero, four, eight, and sixteen are 52.3 atomic %, 50.5 atomic %, 49.0 atomic %, 48.4 atomic %, respectively. The percentages of zinc in the cases where the number of AlN chips is zero, four, eight, and sixteen are 47.2 atomic %, 46.8 atomic %, 46.3 atomic %, 41.0 atomic %, respectively.

From zero to eight in the number of AlN chips, the rate of decrease in the percentage of zinc in accordance with the increase in the number of AlN chips is smaller than the rates of increase in the percentages of aluminum and nitrogen. In addition, the rate of decrease in the percentage of oxygen is larger than that in the percentage of zinc. Accordingly, it is likely that the percentage of oxygen is decreased due to inclusion of aluminum and nitrogen. Since aluminum mainly substitutes for zinc, it is supposed that nitrogen mainly contributes to the decrease in oxygen in the transparent conductive film. This decrease in oxygen by the inclusion of nitrogen in the transparent conductive film can cause generation of oxygen vacancies in the transparent conductive film, and then, carriers due to the oxygen vacancies are generated in the conductive oxynitride including zinc and aluminum. Thus, resistivity of the transparent conductive film can be reduced.

From the comparison between the resistivity graph of FIG. 1C and FIG. 7, it is preferable to use a transparent conductive film formed using approximately two to sixteen AlN chips for the film formation, which has a resistivity lower than or equal to $1.0 \times 10^{-2}$ $\Omega \cdot$cm as shown in FIG. 1C, and the percentage of zinc in such a transparent conductive film is lower than or equal to 47 atomic %. It is supposed that such a transparent conductive film includes approximately 1.0 atomic % to 8.0 atomic % of aluminum and approximately 0.5 atomic % to 4.0 atomic % of nitrogen, from the percentages of components in the transparent conductive films shown in FIG. 7 and Table 2.

However, when the number of AlN chips is increased to sixteen, the rate of decrease in the percentage of zinc is increased and the rate of decrease in the percentage of oxygen is decreased. In addition, the rate of increase in the percentage of aluminum is also increased. Thus, the behavior of the percentage of components in the case where the number of AlN chips is sixteen is different from those in the cases where the number of AlN chips is zero to eight. It is supposed that this difference of behavior affects the decrease in the carrier density and the mobility and the increase in the resistivity when the number of AlN chips is increased from eight to sixteen as shown in FIGS. 1A to 1C.

Further, the higher percentage of aluminum than that of nitrogen corroborates the statement explained with the simulation in Embodiment 1 that aluminum is more likely to be included in zinc oxide as compared to nitrogen.

When the percentage of components in the case where the number of AlN chips is four is compared between the transparent conductive film not subjected to the heat treatment and the transparent conductive film subjected to the heat treatment shown in Table 2 and FIG. 7, it can be understood that the percentage of components in the transparent conductive film does not depend on the heat treatment substantially.

Example 5

In this example, transparent conductive films are formed using conductive oxynitride including zinc and aluminum in a manner different from those of Examples 1 to 4 under an atmosphere including a small amount of oxygen gas, and results of comparison in the transmissivity and the resistivity will be described.

In this example, transparent conductive films were formed with various flow rates of gases for forming the transparent conductive films, which were an oxygen ($O_2$) gas and an argon (Ar) gas. The flow rates (sccm) of the gases for forming the transparent conductive films were as follows: $Ar/O_2$=37/0, 97/0.1, 97/0.35, 97/0.6, 92/2, 42/2, 40/4, and 37/7, and the percentages of the oxygen gas to the whole film formation gas were as follows: $O_2/(O_2+Ar)$=0%, 0.10%, 0.36%, 0.61%, 2.13%, 4.55%, 9.09%, and 15.91%, respectively. The number of AlN chips used for the sputtering film formation was eight, and heat treatment was performed after the film formation at 350° C. for 1 hour under a nitrogen atmosphere. The other film formation conditions were similar to those of Example 1.

Further, a transparent conductive film was formed using ITO as a comparative example. The film formation conditions of the transparent conductive film formed using ITO were as follows: the temperature was room temperature, the pressure was 0.4 Pa, the distance between the substrate and the target was 60 mm, and the direct current (DC) power supply was 0.5 kW. The film formation gas was a mixture of an argon gas, an oxygen gas, and a hydrogen gas, and the flow rate of the film formation gases was $Ar/O_2/H_2$=50/1/1 (sccm). In addition, the transparent conductive film formed using ITO was subjected to heat treatment at 250° C. for 1 hour under a nitrogen atmosphere.

Figure 8:
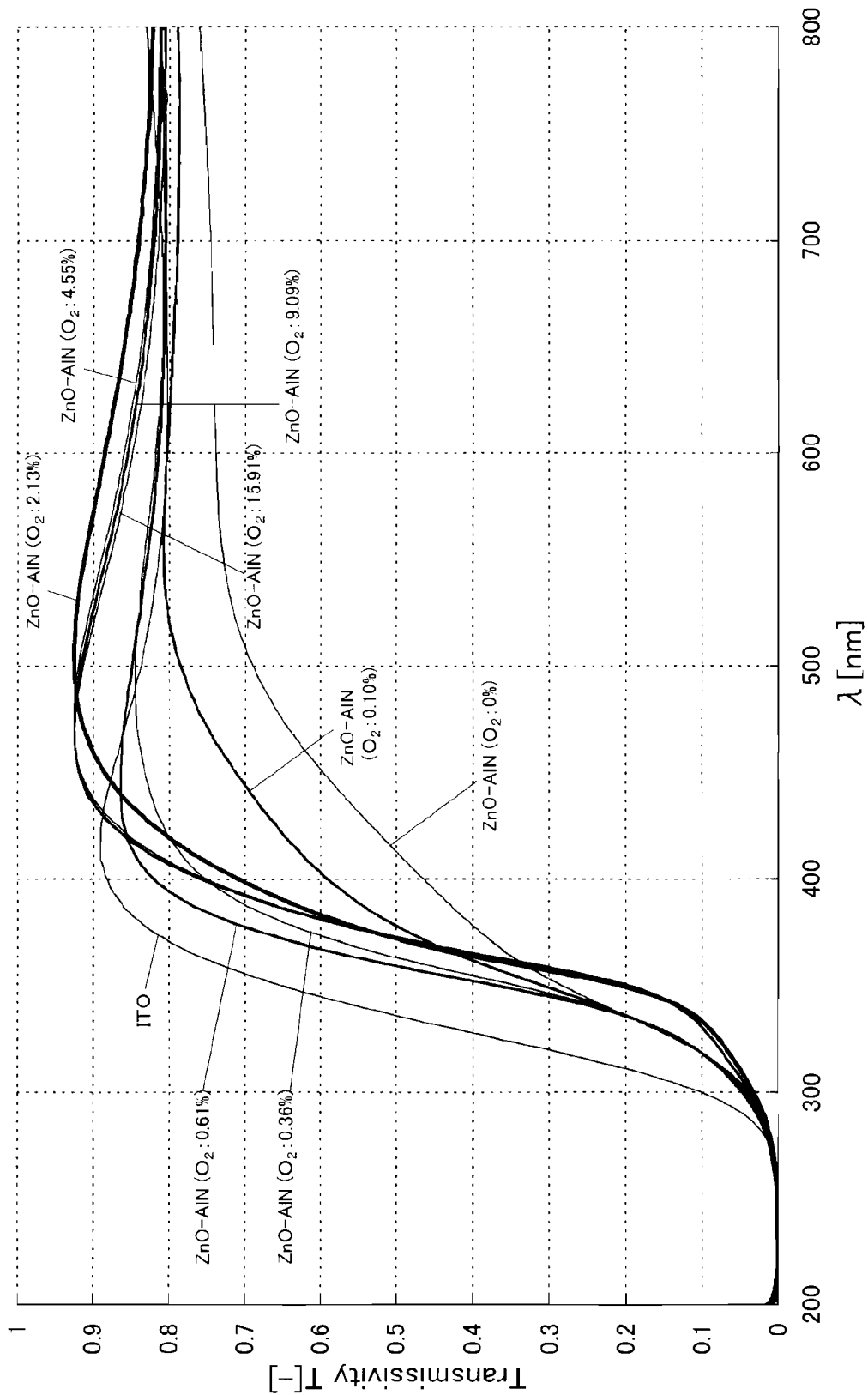
FIG. 8 shows transmissivity measurement results of transparent conductive films.

The transmissivity measurement results of the respective transparent conductive films are shown in FIG. 8. The vertical axis indicates the transmissivity T and the horizontal axis indicates the wavelength λ [nm] in FIG. 8. As compared to the transparent conductive film formed using ITO, which has a transmissivity of 0.8 or higher in a visible light region, the transparent conductive film in the case where the percentage of the oxygen gas is 0% has a lower transmissivity. However, the transparent conductive film in the case where the percentage of the oxygen gas is 0.10% has a transmissivity of approximately 0.8 at a wavelength of 500 nm or longer, the transparent conductive film in the case where the percentage of the oxygen gas is 0.36% has a transmissivity of 0.8 or higher at a wavelength of 420 nm or longer, and the transparent conductive film in the case where the percentage of the oxygen gas is 0.61% has a transmissivity of 0.8 or higher at a wavelength of 400 nm or longer. Further, a transmissivity of 0.8 or higher is obtained at a wavelength of 420 nm or longer in the case where the percentage of the oxygen gas is 2.13% and at a wavelength of 410 nm or longer in the case where the percentage of the oxygen gas is 4.55% to 15.91%. Furthermore, the transparent conductive films in the cases where the percentage of the oxygen gas is 0.36% and 0.61% have almost the same transmissivities as that of the transparent conductive film formed using ITO at a wavelength of 490 nm or longer and at a wavelength of 470 nm or longer, respectively. Moreover, the transparent conductive film in the case where the percentage of the oxygen gas is 2.13% and the transparent conductive films in the cases where the percentage of the oxygen gas is 4.55% to 15.91% have superior transmissivities to that of the transparent conductive film formed using ITO at a wavelength of 450 nm or longer and at a wavelength of 430 nm or longer, respectively.

Resistivities of the transparent conductive films formed using conductive oxynitride including zinc and aluminum are shown in Table 3.

TABLE 3

| | oxygen gas proportion in film formation atmosphere [%] | | | |
|---|---|---|---|---|
| | 0 | 0.10 | 0.36 | 0.61 |
| resistivity [Ω·cm] | 5.8E−03 | 4.1E−02 | 2.0E−02 | 1.1E−02 |

| | oxygen gas proportion in film formation atmosphere [%] | | | |
|---|---|---|---|---|
| | 2.13 | 4.55 | 9.09 | 15.91 |
| resistivity [Ω·cm] | 1.0E−01 | 7.9E−02 | 7.8E−02 | 4.0E−02 |

The transparent conductive film in the case where the percentage of the oxygen gas is 0% has the lowest resistivity, and the transparent conductive film in the case where the percentage of the oxygen gas is 2.13% has the highest resistivity. When the percentage of the oxygen gas for film formation exceeds 2.13%, the resistivity has a tendency to decrease in accordance with the increase in the percentage of the oxygen gas. It can be noticed from the comparison between the data in Table 3 and the data on the transmissivity in FIG. 8 that there is a relationship like a trade-off relationship between the resistivity and the transmissivity. In consideration of the resistivity graph of FIG. 8, the percentage of the oxygen gas in forming the transparent conductive film is preferably higher than or equal to 0.10% and lower than 2.13% in order to obtain a transparent conductive film having a resistivity of $5.0 \times 10^2$ Ω·cm or lower and a transmissivity of 0.7 or higher with respect to visible light having a wavelength of 450 nm or longer. Further, in order to obtain a transparent conductive film having a resistivity of $2.0 \times 10^2$ Ω·cm or lower and a transmissivity of 0.7 or higher with respect to visible light having a wavelength of 400 nm or longer, the percentage of the oxygen gas in forming the transparent conductive film is more preferably higher than or equal to 0.36% and lower than 2.13%.

This application is based on Japanese Patent Application serial no. 2009-123433 filed with Japan Patent Office on May 21, 2009 and Japanese Patent Application serial no. 2009-136538 filed with Japan Patent Office on Jun. 5, 2009, the entire contents of which are hereby incorporated by reference.

What is claimed is:

1. A manufacturing method of a light-transmitting conductive film, comprising:
   forming a light-transmitting conductive film on an insulating layer by a sputtering method in an atmosphere including a rare gas; and
   performing heat treatment on the light-transmitting conductive film,
   wherein the light-transmitting conductive film is electrically connected to one of a source electrode and a drain electrode of a transistor through an opening in the insulating layer,
   wherein the light-transmitting conductive film comprises conductive oxynitride including zinc and aluminum,
   wherein the sputtering method is carried out using a target including zinc oxide and aluminum over which a chip of aluminum nitride is set, and
   wherein an amount of aluminum included in the chip of aluminum nitride is larger than an amount of aluminum included in the target including the zinc oxide and the aluminum.

2. The manufacturing method according to claim 1, wherein the sputtering method is carried out using a target including zinc oxide and aluminum nitride.

3. The manufacturing method according to claim 1, wherein the sputtering method is carried out using a target including zinc oxide over which a chip of aluminum nitride is set.

4. The manufacturing method according to claim 1, wherein the heat treatment is performed under an atmosphere including an inert gas.

5. The manufacturing method according to claim 1, wherein the heat treatment is performed under a nitrogen atmosphere.

6. The manufacturing method according to claim 1, wherein the heat treatment is performed at 250° C. to 350° C.

7. A manufacturing method of a light-transmitting conductive film, comprising:
   forming a light-transmitting conductive film on an insulating layer by a sputtering method in an atmosphere including only a rare gas; and
   performing heat treatment on the light-transmitting conductive film,
   wherein the light-transmitting conductive film is electrically connected to one of a source electrode and a drain electrode of a transistor through an opening in the insulating layer,
   wherein the light-transmitting conductive film comprises conductive oxynitride including zinc and aluminum,
   wherein the sputtering method is carried out using a target including zinc oxide and aluminum over which a chip of aluminum nitride is set, and
   wherein an amount of aluminum included in the chip of aluminum nitride is larger than an amount of aluminum included in the target including the zinc oxide and the aluminum.

8. The manufacturing method according to claim 7, wherein the sputtering method is carried out using a target including zinc oxide and aluminum nitride.

9. The manufacturing method according to claim 7, wherein the sputtering method is carried out using a target including zinc oxide over which a chip of aluminum nitride is set.

10. The manufacturing method according to claim 7, wherein the heat treatment is performed under an atmosphere including an inert gas.

11. The manufacturing method according to claim 7, wherein the heat treatment is performed under a nitrogen atmosphere.

12. The manufacturing method according to claim 7, wherein the heat treatment is performed at 250° C. to 350° C.

13. A manufacturing method of a light-transmitting conductive film, comprising:
   forming a light-transmitting conductive film on an insulating layer by a sputtering method in an atmosphere including a rare gas and an oxygen gas; and
   performing heat treatment on the light-transmitting conductive film,
   wherein the light-transmitting conductive film is electrically connected to one of a source electrode and a drain electrode of a transistor through an opening in the insulating layer,
   wherein the light-transmitting conductive film comprises conductive oxynitride including zinc and aluminum,
   wherein a concentration of the oxygen gas is higher than or equal to 0.10%,
   wherein the sputtering method is carried out using a target including zinc oxide and aluminum over which a chip of aluminum nitride is set, and
   wherein an amount of aluminum included in the chip of aluminum nitride is larger than an amount of aluminum included in the target including the zinc oxide and the aluminum.

14. The manufacturing method according to claim 13, wherein the sputtering method is carried out using a target including zinc oxide and aluminum nitride.

15. The manufacturing method according to claim 13, wherein the sputtering method is carried out using a target including zinc oxide over which a chip of aluminum nitride is set.

16. The manufacturing method according to claim 13, wherein the heat treatment is performed under an atmosphere including an inert gas.

17. The manufacturing method according to claim 13, wherein the heat treatment is performed under a nitrogen atmosphere.

18. The manufacturing method according to claim 13, wherein the heat treatment is performed at 250° C. to 350° C.

* * * * *